United States Patent
Hattori et al.

(10) Patent No.: US 12,444,613 B2
(45) Date of Patent: Oct. 14, 2025

(54) ETCHING PROCESSING METHOD

(71) Applicant: HITACHI HIGH-TECH CORPORATION, Tokyo (JP)

(72) Inventors: Takashi Hattori, Tokyo (JP); Masaki Yamada, Tokyo (JP); Keisuke Akinaga, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 18/026,095

(22) PCT Filed: Feb. 14, 2022

(86) PCT No.: PCT/JP2022/005550
§ 371 (c)(1),
(2) Date: Mar. 13, 2023

(87) PCT Pub. No.: WO2023/152941
PCT Pub. Date: Aug. 17, 2023

(65) Prior Publication Data
US 2024/0312789 A1    Sep. 19, 2024

(51) Int. Cl.
*H01L 21/311* (2006.01)
*H01J 37/32* (2006.01)
*H01L 21/324* (2006.01)

(52) U.S. Cl.
CPC .. *H01L 21/31116* (2013.01); *H01J 37/32522* (2013.01); *H01J 37/32816* (2013.01);
(Continued)

(58) Field of Classification Search
None
See application file for complete search history.

(56) References Cited

U.S. PATENT DOCUMENTS

| 5,022,961 A | 6/1991 | Izumi et al. |
| 5,571,375 A | 11/1996 | Izumi et al. |

(Continued)

FOREIGN PATENT DOCUMENTS

| CN | 109075075 A | 12/2018 |
| JP | 1995-153737 A | 6/1995 |

(Continued)

OTHER PUBLICATIONS

WO2020054476-A1 (translation) (Year: 2020).*

(Continued)

*Primary Examiner* — Roberts P Culbert
(74) *Attorney, Agent, or Firm* — Miles & Stockbridge, P.C.

(57) ABSTRACT

A method for etching a silicon oxide film at a high selection ratio with respect to a silicon nitride film while a high etching rate of the silicon oxide film is balanced with a low etching rate of the silicon nitride film. The etching processing method is a dry etching processing method for etching a film without using plasma by supplying gas into a process chamber, the film having a side wall of a groove or a hole constituted by respective end parts of laminated film layers formed on a wafer, the laminated film layers including silicon oxide films each sandwiched between silicon nitride films, and in which the silicon oxide films are etched laterally from the end parts with the wafer being set to a low temperature equal to or less than (0.040x−42.0° C.) when a partial pressure of hydrogen fluoride gas is taken as x (Pa).

13 Claims, 20 Drawing Sheets

(52) U.S. Cl.
CPC .... *H01L 21/324* (2013.01); *H01J 2237/3344* (2013.01); *H01J 2237/3346* (2013.01)

(56) References Cited

U.S. PATENT DOCUMENTS

| | | | |
|---|---|---|---|
| 9,431,268 | B2 | 8/2016 | Lill et al. |
| 9,613,823 | B2 | 4/2017 | Demichi et al. |
| 10,319,603 | B2 | 6/2019 | Chen et al. |
| 12,125,708 | B2 | 10/2024 | Hattori et al. |
| 2005/0275104 | A1 | 12/2005 | Stamper |
| 2006/0211163 | A1 | 9/2006 | Ouellet et al. |
| 2014/0206198 | A1 | 7/2014 | Tahara et al. |
| 2016/0020115 | A1 | 1/2016 | Demichi et al. |
| 2016/0196984 | A1 | 7/2016 | Lill et al. |
| 2018/0204728 | A1 | 7/2018 | Oomori et al. |
| 2019/0013207 | A1 | 1/2019 | Kobayashi et al. |
| 2019/0027373 | A1 | 1/2019 | Kwon et al. |
| 2019/0027374 | A1 | 1/2019 | Sim et al. |
| 2019/0378724 | A1* | 12/2019 | Toda ................ H01L 21/31116 |
| 2020/0098586 | A1 | 3/2020 | Xia et al. |
| 2020/0111674 | A1 | 4/2020 | Sasahara et al. |
| 2021/0175089 | A1 | 6/2021 | Nishihara et al. |
| 2021/0358772 | A1 | 11/2021 | Igarashi et al. |
| 2021/0375634 | A1 | 12/2021 | Suzuki et al. |
| 2022/0115239 | A1 | 4/2022 | Hattori et al. |

FOREIGN PATENT DOCUMENTS

| | | |
|---|---|---|
| JP | H07-153737 A | 6/1995 |
| JP | H07-169738 A | 7/1995 |
| JP | 2004-127990 A | 4/2004 |
| JP | 2004-296467 A | 10/2004 |
| JP | 2005-161493 A | 6/2005 |
| JP | 2008-502140 A | 1/2008 |
| JP | 2013-074220 A | 4/2013 |
| JP | 2013-219301 A | 10/2013 |
| JP | 2016-025195 A | 2/2016 |
| JP | 2016-129227 A | 7/2016 |
| JP | 2017-050529 A | 3/2017 |
| JP | 2018-207088 A | 12/2018 |
| JP | 2019-016698 A | 1/2019 |
| JP | 2019-114628 A | 7/2019 |
| JP | 2019-212872 A | 12/2019 |
| JP | 2021-089973 A | 6/2021 |
| JP | 2021-180281 A | 11/2021 |
| KR | 10-2021-0126542 A | 10/2021 |
| TW | 201920749 A | 6/2019 |
| WO | WO-2020054476 A1 * | 3/2020 ............. C09K 13/04 |
| WO | 2021182311 A1 | 9/2021 |

OTHER PUBLICATIONS

Search Report mailed Apr. 5, 2022 in International Application No. PCT/JP2022/005550.

Written Opinion mailed Apr. 5, 2022 in International Application No. PCT/JP2022/005550.

Office Action mailed Aug. 16, 2024 in Korean Application No. 10-2023-7005653.

Office Action mailed Dec. 7, 2021 in Japanese Application No. 2021-510470.

Office Action mailed Oct. 28, 2021 in Taiwanese Application No. 110109750.

Search Report mailed Jun. 30, 2020 in International Application No. PCT/JP2020/016071.

* cited by examiner

ETCHING PROCESSING METHOD

TECHNICAL FIELD

The present invention relates to an etching processing method for forming a three-dimensional film structure by machining a plurality of film layers formed in advance on a sample having a substrate shape such as a semiconductor wafer in a step of manufacturing a semiconductor device for a memory or the like, particularly to an etching processing method for isotropically removing a silicon oxide film from among a plurality of film layers.

BACKGROUND ART

In semiconductor devices, further microfabrication and development of a three-dimensional device structure have been promoted in order to respond to demands for low power consumption or an increase in memory capacity. In manufacture of devices having a three-dimensional structure, etching to remove a film in a direction (the lateral direction) horizontal from a wafer surface is widely used, in addition to conventionally performed "vertical (anisotropic) etching" in which etching is performed to form a groove or a hole in a direction perpendicular to the wafer surface. In such a process, instead of a technology to perform removal by strongly acting on the wafer surface only in the upper-down direction, "isotropic etching" in which etching is performed isotropically in the up-down direction and in the right-left direction is used.

Conventionally, in such isotropic etching, a wet process performed with a semiconductor wafer as a sample being immersed with medicinal solution is used, but as a result of microfabrication of the structure of a circuit to be formed, problems such as pattern collapse in which lines collapse due to surface tension of the medicinal solution or etching residue in a minute gap come up to the surface. Furthermore, there are also such problems that a process with a large quantity of medicinal solution is required and that the cost to the environment is large. On that account, in the isotropic etching, it is necessary to replace the conventional wet process using medicinal solution with a dry process using no medicinal solution.

Further, as an example of a film targeted for such isotropic etching, there is a silicon oxide film. Various technologies to etch the silicon oxide film have been conventionally known. For example, Japanese Patent Application Laid-Open No. 07-169738 (Patent Document 1) discloses that an oxide-silicon-based material layer is etched by alcohol and CF-based gas by use of plasma at a temperature of 0° C. or less.

Further, Japanese Patent Application Laid-Open No. 2013-074220 (Patent Document 2) discloses that, as a deposit removal method, etching is performed by use of mixed gas of hydrogen fluoride and methanol at a temperature of 30° C. or less without the use of plasma. Further, Japanese Patent Application Laid-Open No. 2016-025195 (Patent Document 3), U.S. Pat. No. 9,613,823 (Patent Document 4), Japanese Patent Application Laid-Open No. 07-153737 (Patent Document 5), and U.S. Pat. No. 5,571,375 (Patent Document 6) disclose that a silicon oxide film is etched by hydrogen fluoride and alcohol or either of alcohol and vapor, at a temperature of 0° C. to 30° C. or at a temperature from around a room temperature to 40° C., without the use of plasma. Further, Patent Documents 3, 4, 5 also have descriptions about a silicon nitride film.

Further, Japanese Patent Application Laid-Open No. 2019-114628 (Patent Document 7) discloses that a silicon oxide film is selectively etched with respect to another silicon oxide film by hydrogen fluoride and vapor at a temperature of 0° C. to 50° C. without the use of plasma. Japanese Patent Application Laid-Open No. 2005-161493 (Patent Document 8) discloses that a structural body including a silicon oxide film formed on a silicon nitride film is etched by $HF_2^-$ generated from hydrogen fluoride and alcohol, without the use of plasma, that the structural body is heated after that, and further that the structural body is cooled. Further, U.S. patent Ser. No. 10/319,603 (Patent Document 9) discloses that a silicon nitride film is selectively etched laterally from a structure in which the silicon nitride film and a silicon oxide film are laminated, the etching being performed at a temperature of −20° C. or less by use of a precursor containing oxygen and a precursor containing fluorine.

U.S. Pat. No. 9,431,268 (Patent Document 10) discloses a method in which, in terms of a method in which etching is performed by anhydrous HF after OH-containing species are adsorbed onto a surface of a silicon oxide film and made active, the etching is controlled by removing water generated by reaction from a surface of a substrate by heating. Further, Japanese Patent Application Laid-Open No. 2019-212872 (Patent Document 11) discloses that, under a condition at a temperature of −20° C. to 20° C. and at a pressure of 266 Pa to 1333 Pa, a silicon-oxide-based material is etched with respect to other materials including a silicon nitride film by supplying HF gas and OH-containing gas to a substrate.

CITATION LIST

Patent Documents

Patent Document 1: Japanese Patent Application Laid-Open No. 07-169738
Patent Document 2: Japanese Patent Application Laid-Open No. 2013-074220
Patent Document 3: Japanese Patent Application Laid-Open No. 2016-025195
Patent Document 4: U.S. Pat. No. 9,613,823
Patent Document 5: Japanese Patent Application Laid-Open No. 07-153737
Patent Document 6: U.S. Pat. No. 5,571,375
Patent Document 7: Japanese Patent Application Laid-Open No. 2019-114628
Patent Document 8: Japanese Patent Application Laid-Open No. 2005-161493
Patent Document 9: U.S. patent Ser. No. 10/319,603
Patent Document 10: U.S. Pat. No. 9,431,268
Patent Document 11: Japanese Patent Application Laid-Open No. 2019-212872

SUMMARY OF THE INVENTION

Problem to be Solved by the Invention

The above conventional technologies have problems because they have not considered the following points sufficiently.

That is, in machining on a laminated film of a semiconductor device having a three-dimensional structure, e.g., a 3D-NAND flash memory, or in machining on a film structure to form a gate structure for a Fin-type FET, a technology to isotropically etch an oxide film as an insulating member highly accurately and highly selectively with respect to a polycrystalline silicon film or a silicon nitride film is demanded. Particularly, in formation of a 3D-NAND structure, a plurality of silicon oxide (SiO$_2$) films and a plurality of silicon nitride (SiN) films are laminated alternately in the up-down direction, and therefore, after the shape of a hole or a groove with a fine diameter or a deep width is formed in the up-down direction from a film layer on an upper end of such a film structure, such a step may be required that the silicon oxide (SiO$_2$) films exposed to a side wall surface inside the hole or the groove are etched laterally at a high selection ratio with respect to the silicon nitride (SiN) films, such that the silicon oxide films are recessed from end parts of the silicon nitride films, the end parts constituting the side wall surface.

A step of wet etching, as a conventional technology, using a hydrofluoric acid aqueous solution or a buffered hydrofluoric acid aqueous solution as medicinal solution has a problem of etching residue that is a residual of an etching target film near a bottom portion of a minute gap (a hole or a groove) or a problem that the amount of etching on a film layer as a process target varies over an allowable range at different positions in the up-down direction, and thus controllability is impaired.

Further, even in a case where dry etching is used for a step of forming the aforementioned structure, it is difficult to balance a high etching rate for the silicon oxide film with an etching rate for the silicon nitride film in the conventional etching, and thus, there is a problem that it is difficult to etch the silicon oxide film at a high selection ratio with respect to the silicon nitride film. Further, in etching using plasma, the generated amount of active species (radicals) generated by plasma is not sufficient, and the generated amount of the radials or the life thereof is not so sufficient that the radicals satisfactorily reach a lower part of the hole or the groove. Accordingly, there is such a tendency that a lot of radicals are distributed over the top of the hole or the groove (recesses are promoted well), and the amount of radials is smaller toward the bottom of the hole or the groove (recesses are not promoted well), and therefore, there is such as problem that recesses cannot be formed uniformly in the up-down direction.

Thus, the conventional technologies do not consider a point that the film structure including a laminated film as described above cannot be processed with high accuracy or yield.

The present invention is accomplished in view of the above problem, and an object of the present invention is to provide an etching processing method for highly accurately etching a silicon oxide film at a high selection ratio with respect to a silicon nitride film while a high etching rate of the silicon oxide film is balanced with a low etching rate of the silicon nitride film.

Means for Solving the Problems

In order to achieve the above object, one of representative etching processing methods of the present invention is a dry etching processing method for etching a film structure without the use of plasma by supplying gas for process into a process chamber, the film structure being a structure in which a side wall of a groove or a hole is constituted by respective end parts of laminated film layers formed in advance on a wafer placed inside the process chamber, the laminated film layers including silicon oxide films each sandwiched between silicon nitride films in the up-down direction, and the dry etching processing method includes etching the silicon oxide films laterally from the end parts by supplying hydrogen fluoride gas into the process chamber with a temperature of the wafer being maintained to be equal to or less than $(0.040 \text{ x} - 42.0)°$ C. when a partial pressure of the hydrogen fluoride gas is taken as x (Pa).

Further, the present invention is achieved by etching the silicon oxide films laterally from the end parts with the temperature of the wafer being maintained to be equal to or more than $-50°$ C. Here, the partial pressure of the hydrogen fluoride gas is set to be from 50 Pa to 1000 Pa.

Advantageous Effect of the Invention

With the present invention, at the time of etching a silicon oxide film by use of hydrogen fluoride gas, the etching rate thereof is increased by using a higher pressure, and a temperature at which the etching is performed can be made higher. Further, at this time, the etching rate of the silicon nitride film can be maintained to be low. As a result, it is possible to balance etching of the silicon oxide film at a high etching rate with etching of the silicon nitride film at a low etching rate, and as a result, it is possible to etch and remove the silicon nitride film at a high selection ratio with respect to the silicon oxide film with accuracy.

Objects, configurations, and effects other than those described above will be made clear by the description in Modes for carrying out the Invention as below.

MODES FOR CARRYING OUT THE INVENTION

Figure 1:
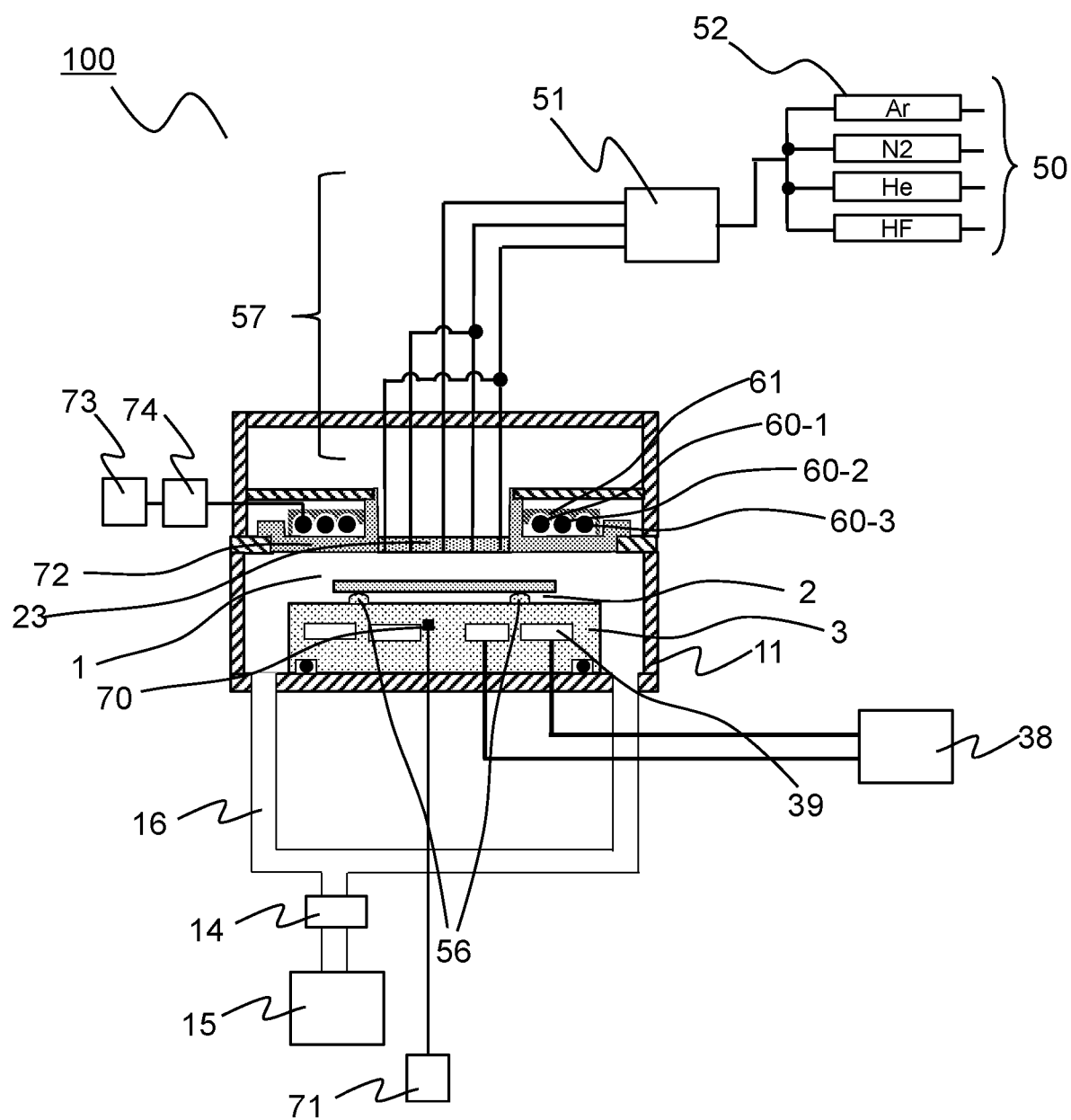
FIG. 1 is a longitudinal sectional view schematically illustrating an outline of a configuration of an etching processing apparatus according to an embodiment of the present invention.

With reference to the drawings, the following describes embodiments of the present invention. Note that the present invention is not limited by the embodiments. Further, in the description of the drawings, the same element has the same reference sign.

The inventors examined etching, by hydrogen fluoride gas (HF) without the use of plasma, on respective single layer films of a silicon oxide film and a silicon nitride film formed by plasma CVD. Results are illustrated in FIGS. 7A to 11B. FIGS. 7A to 11B are graphs each illustrating an example of changes in etching speed over changes in film temperature in a case where respective single layer films of the silicon oxide film and the silicon nitride film were etched by use of hydrogen fluoride gas based on an etching processing method according to an embodiment of the present invention.

As a result of the examination, among examined conditions, under a condition in which the flow rates of HF gas and Ar gas were set to HF/Ar=0.40/0.20 (L/min) and the pressure (total pressure) was 300 Pa, the silicon oxide film and the silicon nitride film were not etched in a range where a wafer temperature was higher than −35° C. In contrast, it was found that, in a range where the wafer temperature is equal to or less than −35° C., the etch rate of the silicon oxide film increases and reaches about 10 nm/min at −40° C. In the meantime, it was found that the etch rate of the silicon nitride film is 1 nm/min or less and remains small even at a low temperature equal to or less than −30° C.

As a result, it was found that, in a temperature range lower than −35° C., a selection ratio as a ratio of the etching rate of the silicon oxide film to that of the silicon nitride film suddenly increases.

The inventors examined the results as follows. It is generally known that, in a case where hydrogen fluoride gas (HF) is used together with vapor (gas) of alcohol or water, a silicon oxide film is etched. The reaction formula of the silicon oxide film at this time is expressed as follows, as also described in Patent Document 8.

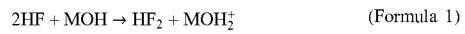

$$2HF + MOH \rightarrow HF_2^- + MOH_2^+ \quad \text{(Formula 1)}$$

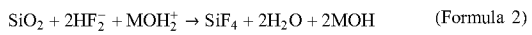

$$SiO_2 + 2HF_2^- + MOH_2^+ \rightarrow SiF_4 + 2H_2O + 2MOH \quad \text{(Formula 2)}$$

Here, M indicates H, $CH_3$, $CH_2CH_3$, or the like.

In a case where HF gas and gas of methanol or water is used, respective gases are first adsorbed on the surface of the silicon oxide film (not expressed in any formula). The adsorbed state is assumed to be a state where particles of HF and methanol or water are liquefied on the surface of the silicon oxide film. After that, two molecules of hydrogen fluoride (HF) react with methanol ($CH_3OH$) or water ($H_2O$) to generate $HF_2^-$ as active species on the surface of the silicon oxide film (Formula 1).

The $HF_2^-$ is important active species, and it is considered that the generation of $HF_2^-$ determines the reaction rate of etching. It is considered that, after that, the $HF_2^-$ reacts with $SiO_2$ to generate $SiF_4$ (having a boiling point of −94.8° C.), and $SiF_4$ volatilizes to cause etching.

In the examination of the inventors, in etching on a silicon oxide film without the use of plasma by use of the hydrogen fluoride gas solely or by use of the hydrogen fluoride gas together with inert gas such as AR, a component containing an OH group such as alcohol or water is not supplied from outside at all. However, since the etching rate in this etching is large to some extent, it is assumed that $HF_2^-$ becomes active species and causes etching. In the etching performed without the use of plasma, reaction by ionic active species generated from a used chemical substance is used. Further, a high frequency source to generate radicals is not necessary.

In the meantime, as indicated by (Formula 2), water is a reaction product, and once etching starts, water is generated continuously. However, in the early stage of the etching, some sort of water to generate $HF_2^-$ is required. Since a very small amount of water is contained in a silicon oxide film targeted for etching, the inventors assumed that the reaction occurred due to the very small amount of water. Further, since an etching processing apparatus (described below) includes, in its inside, a component constituted by a member containing quartz (silicon oxide, $SiO_2$), the inventors assumed that water present inside the member made of quartz also relates to the aforementioned etching.

Subsequently, the inventors examined respective etching rates of a silicon oxide film and a silicon nitride film and the ratio therebetween in a case where the pressure (total pressure) was varied to 600 Pa, 800 Pa, 900 Pa, and 990 Pa with the flow rates of HF gas and Ar gas being kept at HF/Ar=0.40/0.20 (L/min).

As a result, it was found that, as the pressure increases, the upper-limit temperature in a range where the etching rate of the silicon oxide film is large increases, and a range where the silicon oxide film can be etched at a high rate expands to a high-temperature side. Further, it was found that the etching rate of the silicon oxide film increases as the pressure becomes large, and that, in a case where the pressure is 600 Pa or more, a maximum value of the etching rate occurs in a temperature range where the etching rate is large, and at a temperature of a value equal to or less than the maximum value, the etching rate of the silicon oxide film decreases as the temperature decreases.

In the meantime, the etching rate of the silicon nitride film is equal to or less than 1 nm/min even under a condition with a pressure of 600 Pa or more. Accordingly, it was found that the ratio (selection ratio) of the etching rate of the silicon oxide film to the etching rate of the silicon nitride film has a high value and also a maximum value in a range equal to or less than the upper limit of the temperature under a condition of each pressure.

The inventors examined the results as follows. A gas equation based on Boyle-Charles' law is expressed by the following (Formula 3).

$$V = nRT/P \qquad \text{(Formula 3)}$$

(Here, V: volume, P: pressure, T: absolute temperature, n: the number of moles, R: molar gas constant)

From (Formula 3), in order to decrease a volume V of gas with the same number of moles, that is, in order to easily aggregate gas to cause etching, it is apparent that it is necessary to decrease the temperature T or increase the pressure P. When the pressure is set to a value near 900 Pa, adsorption or aggregation of HF onto the silicon oxide film easily occurs, and it is considered that etching consequently occurs at a temperature of −15° C. or less that is a higher temperature.

As illustrated in (Formula 1), in order to generate $HF_2^-$ as active species for the reaction, MOH, herein, water with M=H is required. In the meantime, water is a reaction product as expressed by (Formula 2), and removal of water is indispensable to advance the reaction. When water is present excessively, as described in Patent Document 10, a reaction expressed by the following (Formula 4) occurs, so that $SiO_2$ that is silicon oxide is regenerated, and silicofluoric acid $H_2SiF_6$ is generated.

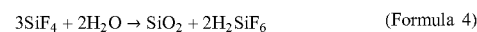

$$3SiF_4 + 2H_2O \rightarrow SiO_2 + 2H_2SiF_6 \qquad \text{(Formula 4)}$$

Accordingly, in order to inhibit regeneration of $SiO_2$ that is silicon oxide, it is necessary to remove water immediately. Here, the melting point of a hydrofluoric acid aqueous solution with a concentration of 50% close to a saturated solution is −35° C. at normal pressure. From this, it is considered that, on the surface of the silicon oxide film, water generated by the reaction is mixed with supplied hydrogen fluoride gas and turns into hydrofluoric acid close to the saturated solution, and when the hydrofluoric acid turns into a solid, water is removed in a sense, so that etching occurs.

In terms of the relationship with pressure, at a pressure of 300 Pa, for example, in a case where the wafer temperature is higher than −35° C., it is considered that a hydrofluoric acid aqueous solution is present as liquid, and water is not removed. As a result, it is considered that a reaction to generate silicon oxide as expressed by (Formula 4) occurs.

Note that, even though water generated by the reaction should be removed, when heating or the like from outside is performed to completely remove water, for example, the reaction of (Formula 1) to generate $HF_2^-$ as active species itself does not occur, so that etching is not advanced continuously.

A temperature of −35° C. as the wafer temperature at a pressure of 300 Pa is a temperature at which the hydrofluoric acid aqueous solution turns into a solid on the surface of the silicon oxide film, and the temperature is considered to be a temperature as a boundary at which etching occurs such that water is removed by being solidified in a state where while water is present on the surface of silicon oxide to some extent. Details of changes in the melting point of the hydrofluoric acid aqueous solution when the pressure is increased are uncertain, but in a case where a high pressure is used, the etching rate of the silicon oxide film exhibits a maximum at a given temperature, and below the given temperature, the etching rate decreases.

The inventors assumed that this result is affected by the following: that from the viewpoint of activation energy of the reaction, the reaction becomes hard to advance at a low temperature; and that $SiF_4$ as a reaction product becomes hard to volatilize in a range with a high pressure and a low temperature.

The inventors further performed etching on respective single layer films of a silicon oxide film and a silicon nitride film that are similar to those illustrated in FIGS. 7A to 11B with the partial pressure of HF being changed by changing the ratio of the flow rates of HF gas and Ar gas while the pressure (total pressure) was maintained at 900 Pa, and the inventors examined results thereof (FIGS. 14A to 18B).

As a result, under a condition where the total pressure is 900 Pa and the partial pressure of hydrogen fluoride (HF) is 200 Pa, when the wafer temperature is a temperature higher than −35° C., etching on the silicon oxide film and the silicon nitride film does not occur or is very small. In the meantime, it was found that, in a range where the temperature is −35° C. or less, the etch rate of the silicon oxide film increases and becomes about 13 nm/min at −40° C. In the meantime, it was found that the etch rate of the silicon nitride film has a value within a range equal to or less than 1 nm/min even at a low temperature equal to or less than −30° C. and is relatively very small.

Further, it was found that, in a case where the partial pressure of HF is varied to 400 Pa, 675 Pa, 720 Pa, and 900 Pa, the upper limit of a temperature range where etching on the silicon oxide film is relatively large becomes higher as the partial pressure becomes larger, and the temperature range where the etching is performable expands to a higher side. Further, it was found that the etching rate of the silicon oxide film increases as the partial pressure of HF becomes larger. Further, it was found that, in a case where the partial pressure of HF is 400 Pa or more, the etching rate has a maximum value at a specific temperature, and the etching rate of the silicon oxide film decreases as the temperature becomes lower than the temperature at the maximum value.

In the meantime, even when the HF partial pressure was increased, the etching rate of the silicon nitride film was kept small at 1 nm/min or less and did not change. As a result, it was found that a selection ratio as a ratio of the etching rate of the silicon oxide film to that of the silicon nitride film increases as the partial pressure of HF increases, and a temperature region where the selection ratio is 20 or more becomes wide.

Figure 19A:
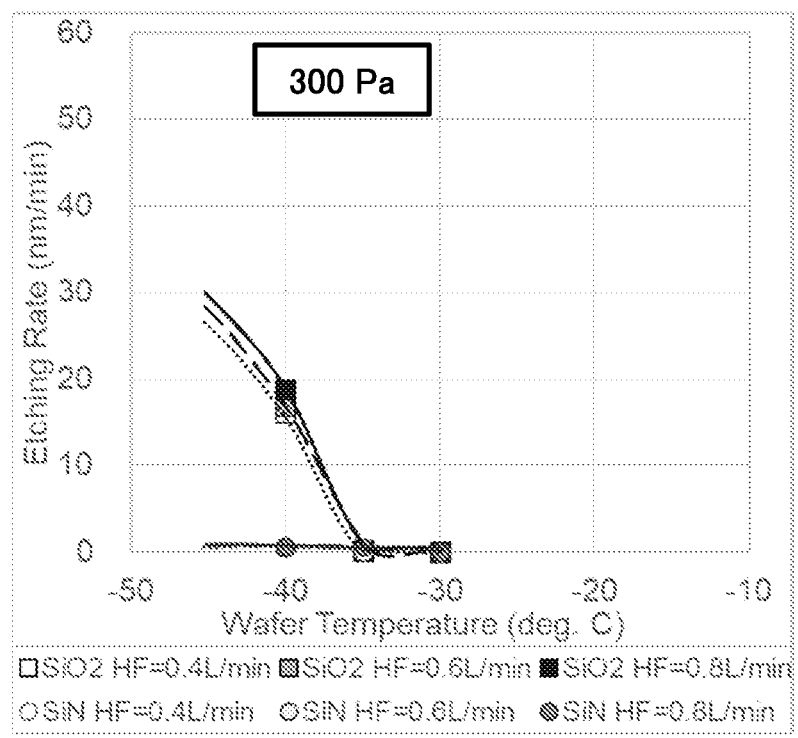
FIGS. 19A and 19B are graphs illustrating an example of changes in etching speed over changes in film temperature in a case where respective single layer films of the silicon oxide film and the silicon nitride film were etched by use of hydrogen fluoride gas in the etching processing apparatus according to the embodiment illustrated in FIG. 1.
Figure 19B:
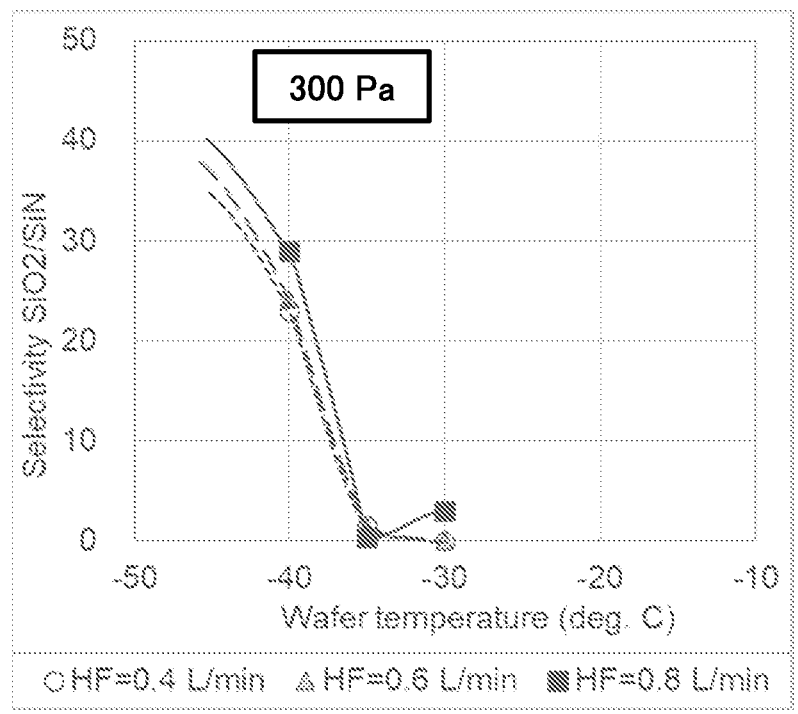

The inventors further performed etching on a silicon oxide film and a silicon nitride film, similarly to the above, such that the total pressure was set to 300 Pa, the Ar flow rate was maintained at 0.20 L/min, and the HF flow rate was varied to a plurality of different values (FIGS. 19A and 19B).

As a result, it was found that, in a case where the HF flow rate is varied to 0.40, 0.60, 0.80 L/min, the etching rate of the silicon oxide film slightly increases as the HF flow rate increases, but a temperature range where the etching rate becomes large and the upper limit of the temperature range do not change or only slightly change. From this, it was found that the previously described increase in the etching rate of the silicon oxide film and the increase in the temperature at which etching occurs do not have a large correlation with the flow rate of HF.

Figure 20:
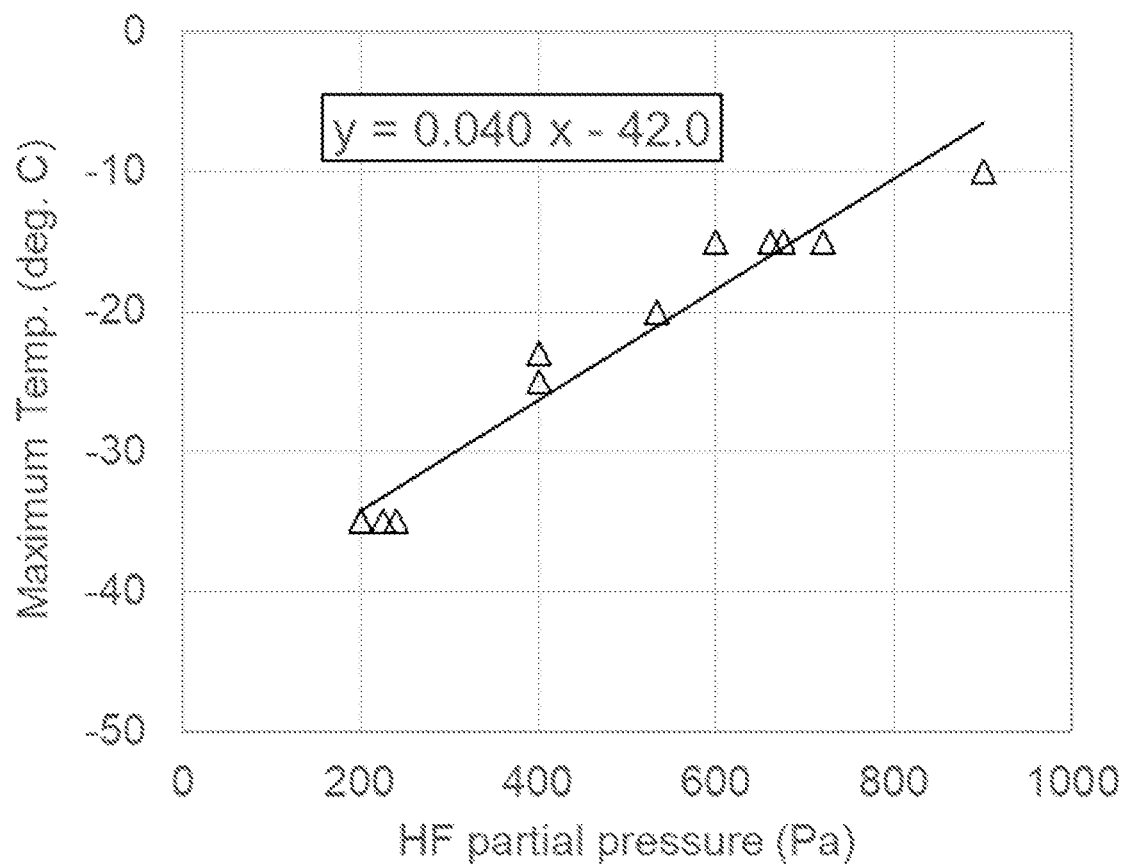
FIG. 20 is a graph illustrating the relationship of changes in the temperature of a wafer with changes in the partial pressure of hydrogen fluoride (HF) gas in a case where respective single layer films of the silicon oxide film and the silicon nitride film are etched by use of the hydrogen fluoride gas in the etching processing apparatuses according to the embodiments illustrated in FIGS. 1 and 12.

From the results obtained by varying the values of the flow rates and the pressures of HF and Ar gas to be supplied as described above, the inventors examined details of changes in the upper limit (maximum value) of the temperature range where etching on the silicon oxide film becomes large as the partial pressure of HF gas changes. As a result, it was found that the change in the upper limit of the temperature range where the etching rate of the silicon oxide film becomes large with respect to the change in the value of the partial pressure of HF gas to be supplied can be approximated to a linear function. As a result of the examination, the inventors found that, in isotropic etching on a silicon oxide film by use of HF gas, there is a proportional relationship between gas supply and a condition of temperature in the etching, as illustrated in FIG. 20. Further, it was found that the straight line can be expressed by Formula (5).

$$y = 0.040x - 42.0 \quad \text{(Formula 5)}$$

From the above-mentioned examinations, the inventors obtained the knowledge that, in a case where the silicon oxide film is etched isotropically, when a partial pressure x of HF gas is set to a range from 50 Pa to 1000 Pa, and a film temperature y is set to a value equal to or less than y=0.040x−42.0 as expressed by (Formula 5) but equal to or more than −60° C., desirably equal to or more than −50° C., the silicon oxide film can be etched at a high selection ratio and a high speed with respect to the silicon nitride film. Further, the inventors found that, when the film temperature y is made higher than y=0.040x−42.0 as expressed by (Formula 5), the etching rate of the silicon oxide film and the selection ratio of the silicon oxide film with respect to the silicon nitride film become remarkably low, and based on such findings, the inventors conceived the present invention.

Embodiment 1

The following describes details of an embodiments of the present invention with reference to the drawings.
(Etching Processing Apparatus—1)

With reference to FIG. 1, the following describes an outline including a whole configuration of an etching processing apparatus according to an embodiment of the present invention. FIG. 1 is a longitudinal sectional view schematically illustrating an outline of the configuration of the etching processing apparatus according to the embodiment of the present invention. An etching processing apparatus 100 in the present embodiment includes a process chamber placed inside a vacuum chamber, a wafer stage placed in a lower part in the center of the process chamber and configured to support a semiconductor wafer as a process target, and a lamp placed above the process chamber and around a supply port from which gas for process or particles are supplied, the lamp being configured to apply an electromagnetic wave such as infrared light to the semiconductor wafer placed on the stage and heat the wafer.

That is, a process chamber 1 is configured as a space placed inside a base chamber 11 and at least partially having a cylindrical shape, and a wafer stage 3 having a cylindrical shape and configured to support a wafer (semiconductor wafer) 2 as a process target placed on an upper surface of the wafer stage 3 is placed inside the process chamber 1. A shower plate 23 having a plurality of holes through which the gas for process is introduced is placed in a central part of a top surface of the process chamber 1, above the upper surface of the wafer stage 3. The shower plate 23 is a circular member constituting a ceiling surface of the process chamber 1 and having a shape larger than the diameter of the wafer 2, and a window member forming the ceiling surface of the process chamber 1 and constituted by a member through which the electromagnetic wave from the lamp surrounding the shower plate 23 in a ring shape passes is placed on an outer peripheral side of the shower plate 23.

The shower plate 23 is connected to a plurality of gas introduction tubes 57 through which process gas circulates, and the inside of the gas introduction tubes 57 communicates with the through-holes. As the process gas to be supplied to the gas introduction tubes 57, source gases flowing through a plurality of source gas ducts each provided for each type of a plurality of source gases join to be mixed with each other and supplied to the gas introduction tubes. The flow rate or the speed of the source gas flowing through the source gas duct is adjusted by a massflow controller 50 placed on the source gas duct.

Further, the plurality of source gas ducts joins together into one in a part on the downstream side from respective massflow controllers 50 and is connected to one end of a gas distributor 51. The plurality of gas introduction tubes 57 connected to the shower plate 23 is connected to the other end of the gas distributor 51, and further, the gas introduction tubes are connected respectively to a plurality of introduction parts for the process gas, the plurality of introduction parts including the vicinity of the center of the process chamber 1 and the vicinity of the outer periphery of the process chamber 1. Hereby, the gas distributor 51 can supply the process gas by independently controlling the flow rate or the composition of the process gas directed toward each part, and thus, the gas distributor 51 is configured to minutely adjust the distribution of partial pressures of the process gas inside the process chamber 1 in terms of the radial direction or the circumferential direction of the wafer 2.

Note that, in the example illustrated in this figure, as the source gases of the process gas, Ar, $N_2$, He, HF are described, but other process gases may be also supplied.

A gas discharge port to which an evacuation pipe 16 is connected is placed in a bottom portion of the process chamber 1. The gas discharge port is connected to the inlet of a gas discharge pump 15 via the evacuation pipe 16. The gas discharge pump 15 in the present embodiment is constituted by, for example, a turbomolecular pump, a mechanical booster pump, or a dry vacuum pump.

Further, on the evacuation pipe 16 between the gas discharge port and the inlet of the gas discharge pump 15, a pressure adjustment valve 14 configured to adjust the flow rate or the speed of gas to be discharged by increasing or decreasing a flow-path sectional area inside the evacuation pipe 16 is provided to adjust the pressure of the process chamber 1.

In a part surrounding the outer periphery of the shower plate 23, above the process chamber 1, an IR lamp unit configured to heat the wafer 2 by applying an electromagnetic wave to the wafer 2 is provided. The IR lamp unit in the present embodiment mainly includes an IR lamp 60 placed in a ring or round shape, a reflector 61 placed in a ring shape above the IR lamp 60 to cover the IR lamp 60, and an IR light transmission window 72 constituted by a ring-shaped member such as quartz having a light-transmitting property, the IR light transmission window 72 constituting the top surface of the process chamber 1 below the IR lamp 60. In a central part of the IR lamp unit, a circular space for providing the shower plate 23 is placed.

As the IR lamp 60 in the present embodiment, a plurality of lamps having a circular shape (a round shape) is used. As the plurality of lamps, IR lamps 60-1, 60-2, 60-3 are placed in a triple manner from an inner peripheral side toward an outer peripheral side of the process chamber 1 having a cylindrical shape such that each of the IR lamps 60-1, 60-2, 60-3 makes one lap around the central axis, in the up-down direction, of the process chamber 1, so as to reduce variations in the amount of heating or temperature distribution in the circumferential direction of the wafer 2, but the number of lamps in one lap or the number of laps (the number of folds in the IR lamp 60) can be selected in accordance with demanded specifications. Note that the electromagnetic wave emitted from the IR lamps is light (here, referred to as IR light) mainly including light in a range from visible light to infrared light.

Above the IR lamps 60-1, 2, 3, the reflector 61 by which emitted IR light is reflected downward (in a direction toward the wafer 2 or a wafer mounting surface of the wafer stage 3) is placed. Further, it is desirable that the member having the light-transmitting property for the ring-shaped IR light transmission window 72 placed below the IR lamps 60-1, 2, 3 and constituting the ceiling surface of the process chamber 1 be a member through which the IR light can be transmitted, the member containing no alkali metal ion or the like and having a heat-resisting property. In the present embodiment, quartz is used.

An IR lamp power supply 73 is electrically connected to the IR lamp 60, and emission of the IR light from the IR lamp 60 and the amount (intensity) of the IR light are adjusted in response to supply of electric power from the IR lamp power supply 73. A high-frequency cut filter 74 configured to restrain noise in high-frequency power from flowing into the IR lamp power supply 73 is placed between the IR lamp 60 and the IR lamp power supply 73. Further, the IR lamp power supply 73 has a function to independently adjust electric power to be supplied to each of the IR lamps 60-1, 2, 3 and is configured to adjust the amount of heating of the wafer 2 and the temperature distribution in the radial direction.

A flow path 39 through which circulating refrigerant for adjusting the temperature of a substrate of the wafer stage 3 circulates is placed inside the wafer stage 3. The flow path 39 is connected to a chiller 38 placed outside the etching processing apparatus 100 via a duct, and the temperature of the refrigerant circulating and then returning is adjusted in the chiller 38 to a value in a range suitable for process and is supplied to the flow path 39. As the chiller 38 in the present embodiment, a chiller that can adjust the temperature of the refrigerant in a range from 20° C. to −60° C. is used.

Further, the wafer stage 3 indirectly adjusts the temperature of the wafer 2 via a medium such as gas supplied between the wafer 2 supported on the wafer stage 3 and the upper surface of the wafer stage 3. That is, a plurality of protrusions 56 is provided on an upper surface of the substrate of the wafer stage 3 covered with a dielectric, and the wafer 2 placed on the upper surface of the wafer stage 3 is supported on upper ends of these protrusions 56. The height of each of the protrusions 56 is desirably around 0.1 mm to 1.0 mm, and the number of points to be supported is desirably equal to or more than 3. In the present embodiment, six protrusions 56 having a height of 0.25 mm from the upper surface of the wafer stage 3 are used (at six places). As the substrate of the wafer stage 3, a highly thermally conductive material made of metal or a metal compound having corrosion durability can be used.

A gap is formed between the upper surface of the wafer stage 3 and a back surface of the wafer 2 due to the protrusions 56. Accordingly, when inert gas such as He, Ar, or $N_2$ is supplied into the process chamber 1 from gas introduction holes in the shower plate 23, the inert gas also enters the gap and spreads, and hereby, heat conduction between the wafer stage 3 and the wafer 2 is promoted such that the temperature of the wafer 2 is adjusted to a value closer to that of the wafer stage 3. Note that the adjustment of the temperature of the wafer 2 may be performed in a state where the wafer 2 is electrostatically adsorbed to the wafer stage 3 as illustrated in the following alternative embodiment.

Further, a thermoelectric couple 70 configured to measure the temperature of the stage is placed inside the wafer stage 3 in the present embodiment, and the thermoelectric couple is connected to a thermocouple thermometer 71. The inventors have confirmed that the temperature of the wafer stage 3, detected by the thermocouple thermometer receiving output from the thermoelectric couple 70, has a value within ±1° C. from the temperature set by the chiller 38.

The wafer stage 3 in the present embodiment has an advantage that its structure is simplified and achieved at low cost. Note that, in a case where the wafer 2 is placed inside the process chamber 1 depressurized to a predetermined degree of vacuum, but the process is not performed, that is, in a case of a so-called idle state, heat transmission to the wafer 2 by conduction from its periphery is reduced remarkably, and therefore, it takes time for the temperature of the wafer 2 to start to change to that of the wafer stage 3 after inert gas is introduced. Further, since a member is provided between the wafer 2 and the flow path 39 through which the refrigerant flows, the actual temperature of the wafer 2 easily has a high value relative to the temperature of the refrigerant, set by the chiller 38, and it is found that, in the present embodiment, the actual temperature of the wafer 2 is higher than the temperature set by the chiller 38 by about 10° C.

Note that, for the adjustment of the temperature of the wafer stage 3 used in the etching processing apparatus 100 in the present embodiment, a Peltier element or the like can be used as a thermoelectric conversion device.

In the etching processing apparatus 100, a surface inside the chamber that is exposed to hydrogen fluoride gas, e.g., the surface of a member inside the process chamber 1, or the like, may be heated to a predetermined temperature at a predetermined timing. For example, the surface inside the chamber may be heated to a temperature about 40° C. to 120° C. Hereby, it is possible to inhibit adsorption or deposition of particles of hydrogen fluoride gas or the like to members constituting the inner surface of the process chamber 1 and to reduce corrosion of these members.

In the present embodiment, HF gas is supplied during the process on the wafer 2 to set the pressure inside the process chamber 1 to a predetermined value in a range from 50 Pa to 1000 Pa, for example, and the temperature of the wafer 2 is set to a range from −10° C. to −60° C. As described above, in the examination of the inventors, under such a condition, HF may to liquefy or furthermore solidify by aggregating on the silicon oxide film. In a case where an electrostatic adsorption method is used, when solidification or liquefaction also occurs on the back surface of the wafer, a sealing band for back-surface coolant gas may break, so that coolant gas such as He, for example, may leak out and an electrostatic chuck may have an error. In the meantime, a close-contact cooling stage originally has a gap, and therefore, even when solidification or liquefaction of HF occurs, the wafer stage does not have an error, so that the process is stably performable.

Further, in the electrostatic adsorption method, the gap between the wafer and the stage is small, and therefore, when solidification or liquefaction of HF occurs, the wafer is easily stuck to the stage due to surface tension. Accordingly, when the wafer is lifted by a pusher pin at the time of de-chuck of the wafer, such a problem that the wafer cracks might occur. In this regard, since the close-contact cooling method in which a gap of 0.25 mm is formed between the wafer and the stage is employed this time, such a problem that the wafer is stuck to the stage due to solidification or liquefaction of HF can be reduced.

Like the present invention, in a process using a low temperature, dew drops occur in a component part making contact with the atmosphere inside an electrostatic chuck electrode as a cooling source, and a short-circuit may be caused in an electric circuit such as a power supply portion. In this respect, the structure of the stage in the close-contact cooling method in which an electrode internal part is simplified is also advantageous.

A structure of a film targeted for the present invention will be described with reference to FIGS. 2A and 2B. FIGS. 2 A and 2B are longitudinal sectional views schematically illustrating an example of a film structure on a wafer to be processed by the etching processing apparatus according to the embodiment illustrated in FIG. 1. The film structure in the present embodiment has a structure in which silicon oxide films and silicon nitride films formed in advance on the upper surface of the wafer 2 are laminated alternately.

Figure 2A:
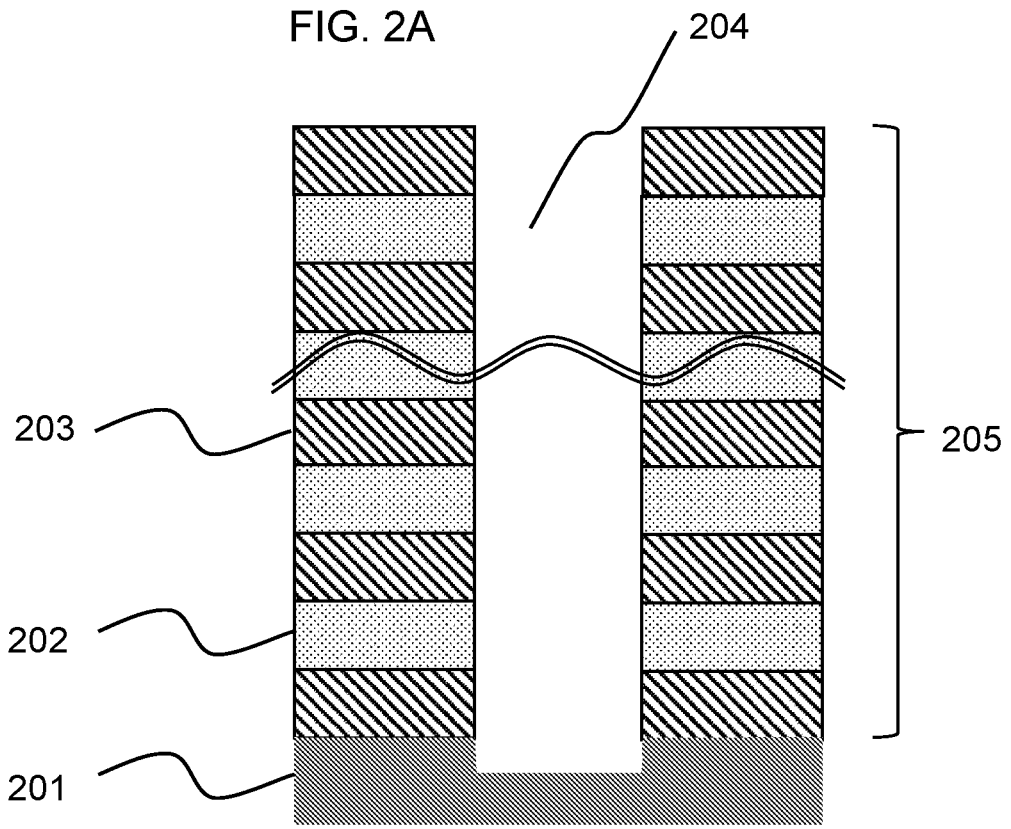
FIGS. 2A and 2B are longitudinal sectional views schematically illustrating examples of a film structure on a wafer to be processed by the etching processing apparatus according to the embodiment illustrated in FIG. 1.

As illustrated in FIG. 2A, a film structure in which a plurality of silicon oxide films ($SiO_2$ films) 203 and a plurality of silicon nitride films ($Si_xN_y$, SiN films) 202 are laminated alternately in the up-down direction is placed on a substrate 201 made of silicon in the wafer 2, the film structure having a hole or a groove shape penetrating through a predetermined number of film layers in the up-down direction (the depth direction) from the uppermost surface of the films thus laminated. The hole or the groove of such a film structure has an opening 204 on the surface of a film layer (in this figure, the silicon oxide film 203) as the uppermost layer, and the film structure is a structure necessary for 3D-NAND.

The film structure includes dozens of or several hundred layers laminated on top of one another. In the present embodiment, the film thickness of the silicon oxide film 203 is from a few nanometers to 100 nm, and the film thickness of the silicon nitride film 202 is from a few nanometers to 100 nm, so that the thickness of the whole film structure 205 is from a few micrometers to dozens of micrometers. Further, the width of the opening 204 is dozens of nanometers to several hundred nanometers.

Figure 2B:
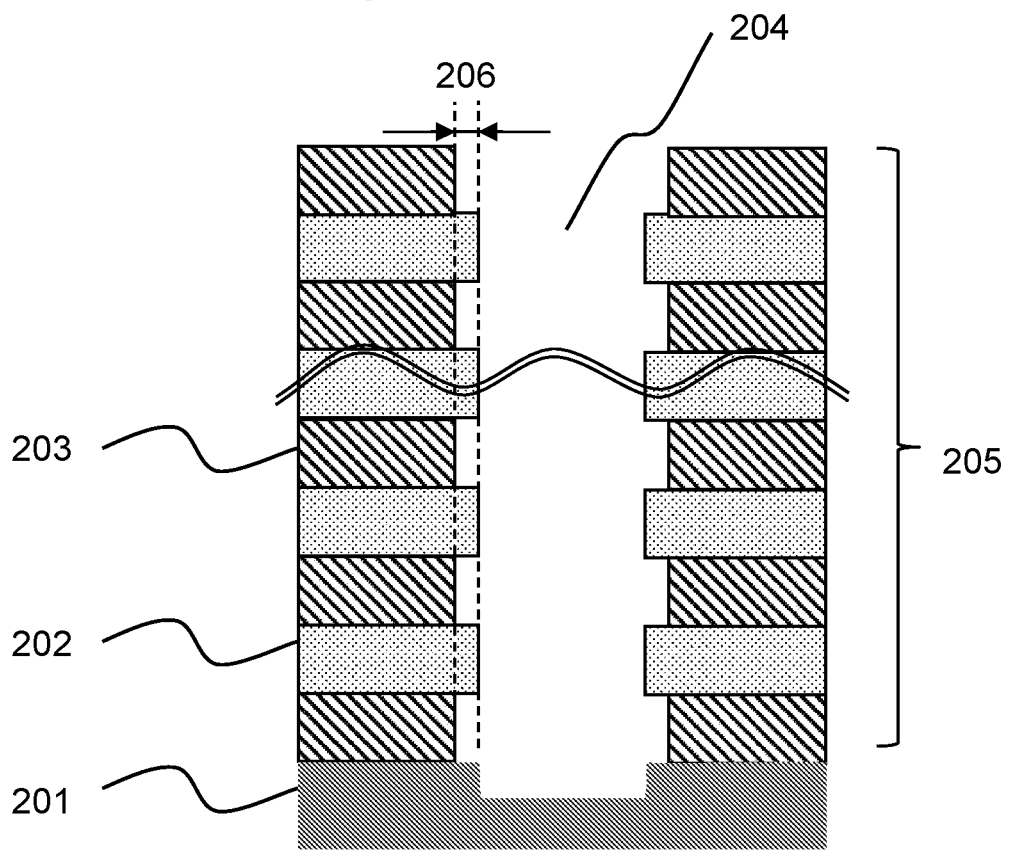

By using steps of an etching process in the present embodiment (described later), an end surface of each silicon oxide film 203 constituting a side wall surface of the hole or the groove reacts with HF gas entering the hole or the groove from the opening 204 and is etched at a high selection ratio to the silicon nitride films 202 on the upper side and on the lower side from the each silicon oxide film 203, as illustrated in FIG. 2B. The end surface of the each silicon oxide film 203 the end surface of which is removed by etching is removed by reacting with supplied HF gas again, so that the each silicon oxide film 203 is etched laterally (the right-left direction in the figure), whereas the positions of respective end surfaces of the silicon nitride films 202 sandwiching the each silicon oxide film 203 from the upper side and the lower side do not largely change. A dimension 206 of the lateral etching in the present embodiment is from a few nanometers to dozens of nanometers, and around 10 nm is optimum.

Figure 3:
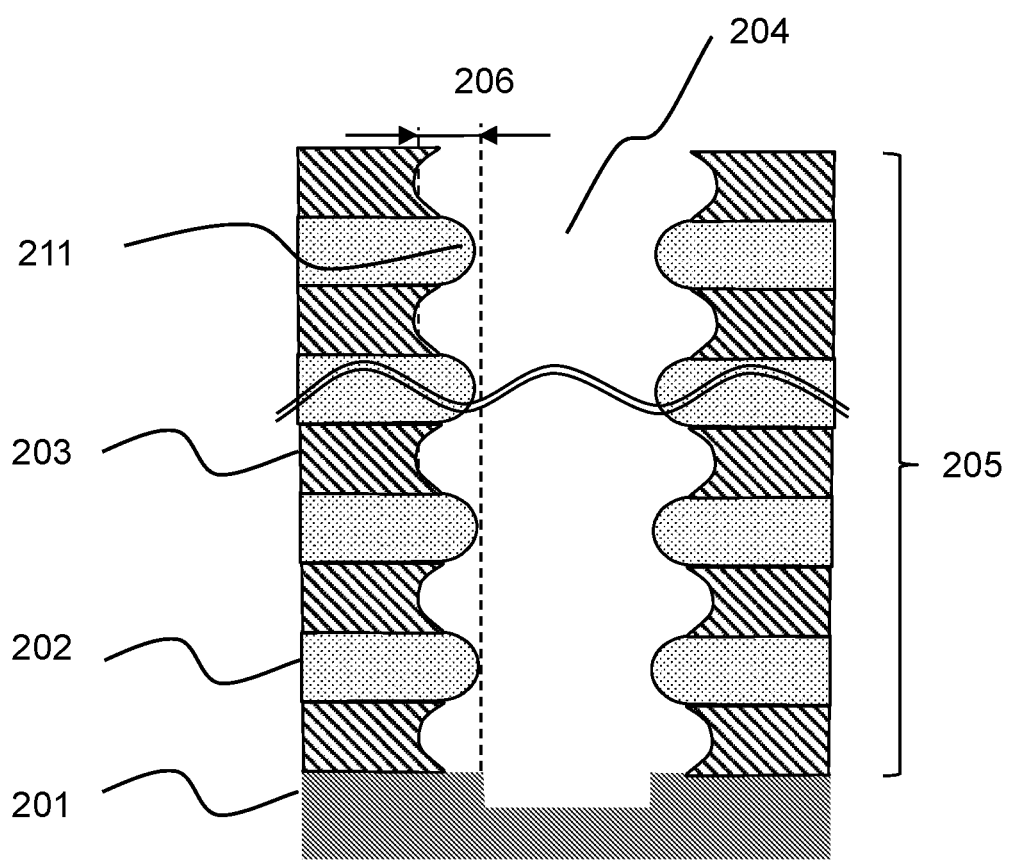
FIG. 3 is a longitudinal sectional view schematically illustrating examples of a shape after processing in a case of a low selection ratio in an etching process on the film structure on the wafer illustrated in FIGS. 2A and 2B.

At the time of the lateral etching on the silicon oxide film 203, the selection ratio of the silicon oxide film 203 to the silicon nitride film 202 is desirably 15 or more, particularly desirably 20 or more. In a case where the selection ratio is low, etching on the silicon nitride film 202 advances in parallel to the etching on the silicon oxide film. In such a case, as illustrated in FIG. 3, the shape of an end part of the silicon nitride film 202 after the etching becomes not a rectangular shape but a round shape, and this might adversely affect the performance of a semiconductor device formed of a film structure having such a shape. FIG. 3 is a longitudinal sectional view schematically illustrating an example of a shape after processing in a case where the selection ratio is low in the etching process on the film structure on the wafer illustrated in FIGS. 2 A and 2B.

According to the experience of the inventors, in terms of the etching process in the present embodiment on the film structure in which the silicon oxide films 203 and the silicon nitride films 202 are laminated, as illustrated in FIG. 2A, in a case where the selection ratio is equal to or more than 15, more desirably equal to or more than 20, a shape closer to a rectangular shape as illustrated in FIG. 2B is formed on the end surface of each film layer constituting the side wall surface of the groove or the hole. In the meantime, in a case where the selection ratio is less than 15, particularly equal to or less than 10, the shape of the end part of the silicon nitride film becomes a round shape as illustrated in FIG. 3, and this is undesirable.

Note that, as the substrate 201 used in FIGS. 2A and 2B, a substrate made of silicon, a substrate made of silicon germanium, or the like can be used, but the substrate 201 is not limited to this. The silicon oxide films ($SiO_2$ films) 203 and the silicon nitride films (SiN) 202 used in the present embodiment illustrated in this figure form a film structure in which they are laminated alternately and are formed consecutively by plasma CVD or the like used generally, but they may be formed by other conventionally known technologies, e.g., a chemical vapor deposition method (the CVD method), an atomic layer deposition method (the ALD method), a sputtering method, a precursor coating method, a burning method, and so on.

At the time of performing etching on the film structure, as illustrated in FIGS. 2A and 2B, in which the silicon oxide films 203 targeted for the etching and the silicon nitride films 202 are each sandwiched between the silicon nitride films 202 in the up-down direction and respective end parts of laminated film layers constitute the side wall of the groove or the hole, a deposit may be formed on the surface of the film structure. In such a case, after the execution of the step of etching, a step of thermally decomposing and eliminating the deposit formed on the surface of the film by heating the wafer 2 by use of means such as the IR lamp 60 may be performed. By performing this step, the surface of the film structure can be made smoother.

Note that, in the present embodiment, the IR lamp 60 is used for the heating of the wafer 2, but the means to heat the wafer 2 is not limited to this, and a configuration in which the wafer 2 is heated by a heater provided in the wafer stage 3 may be employed, or the wafer may be transferred to another device for heating and subjected to heating, for example. Further, inert gas such as Ar gas or nitrogen gas can be introduced at the time when an electromagnetic wave is applied by the IR lamp 60.

(Procedure of Etching Process—1)

Figure 4:
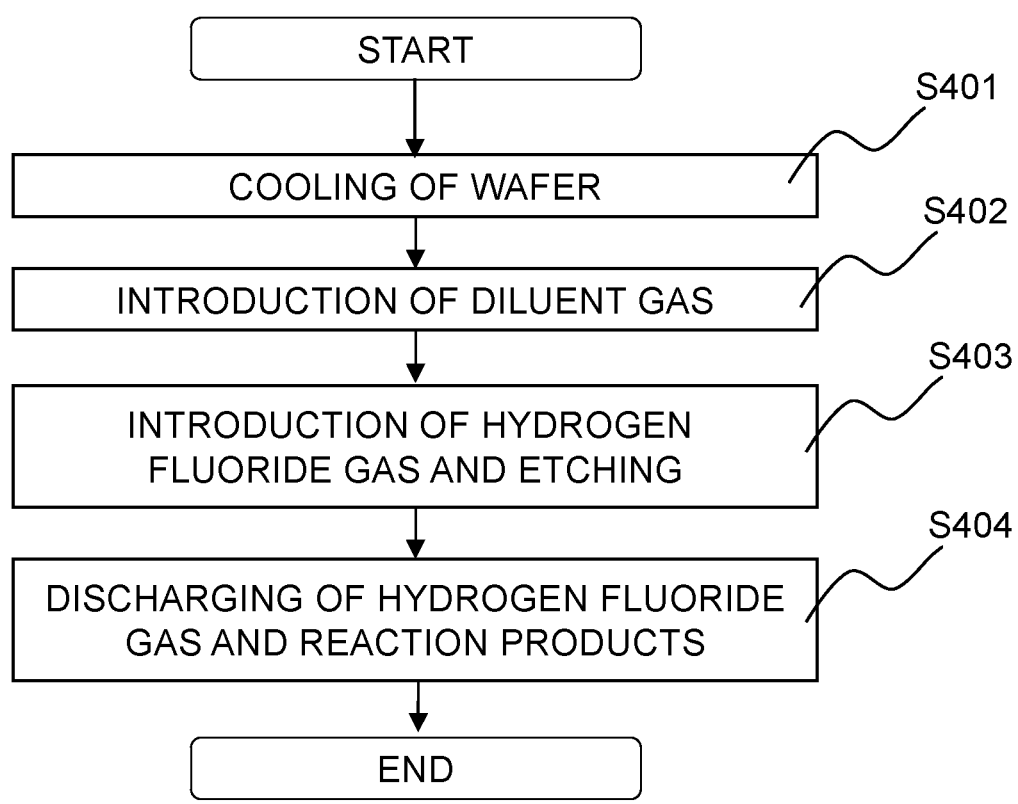
FIG. 4 is a flowchart schematically illustrating the procedure of operations of a process of etching the film structure illustrated in FIGS. 2A and 2B by the etching processing apparatus according to the embodiment illustrated in FIG. 1.
Figure 5:
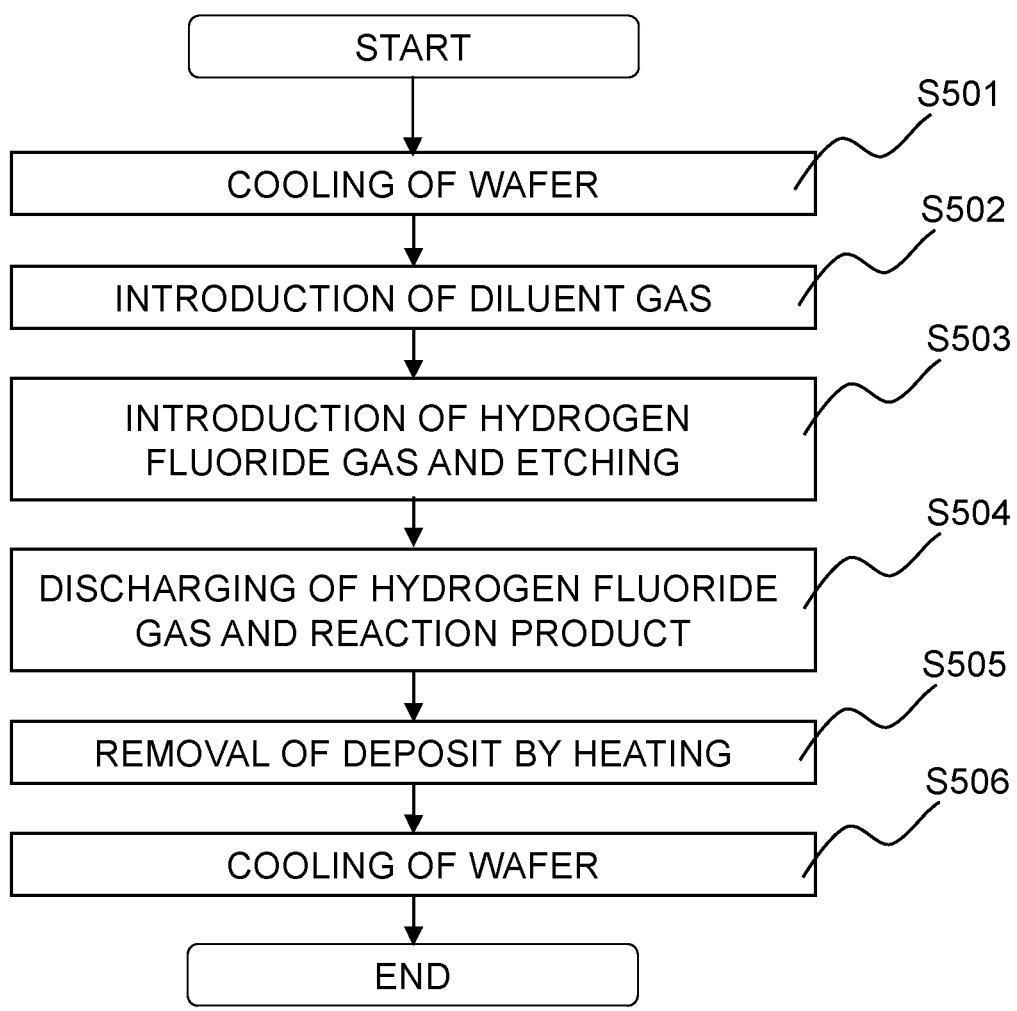
FIG. 5 is a flowchart schematically illustrating the procedure of operations of a process of etching the film structure illustrated in FIGS. 2A and 2B by the etching processing apparatus according to the embodiment illustrated in FIG. 1.
Figure 6:
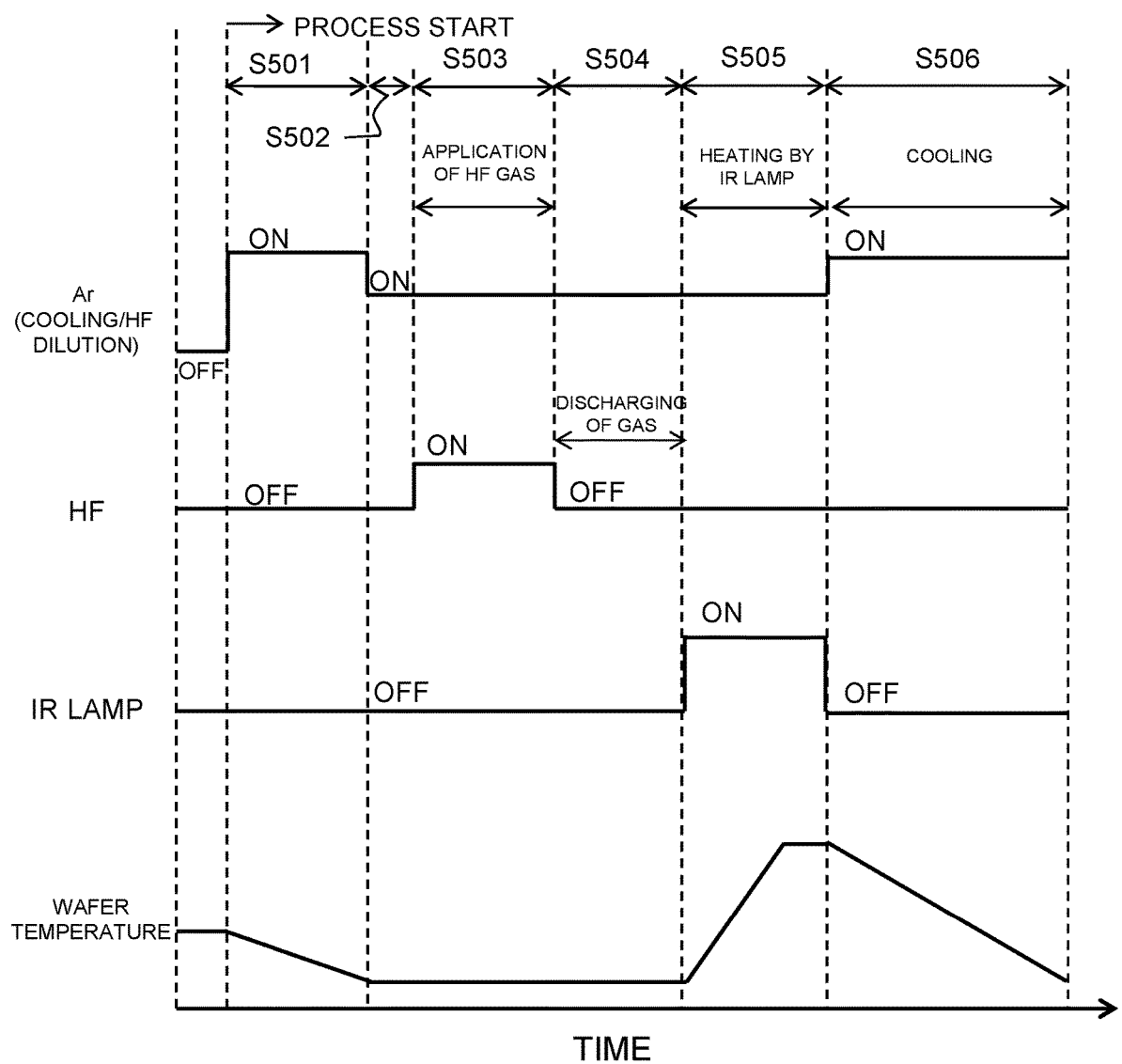
FIG. 6 is a time chart illustrating an example of the operation of the etching processing apparatus according to the embodiment illustrated in FIG. 1 along the passage of time in an etching process performed by the etching processing apparatus along the procedure illustrated in FIG. 5.

Next will be described the etching process by hydrogen fluoride gas in the embodiment with reference to FIGS. 4, 5, 6. FIGS. 4, 5 are flowcharts each schematically illustrating the procedure of operations in a process of etching the film structure illustrated in FIGS. 2 A and 2B by the etching processing apparatus according to the embodiment illustrated in FIG. 1. FIG. 6 is a time chart illustrating an example of operations of the etching processing apparatus along passage of time of the etching process performed by the etching processing apparatus according to the embodiment illustrated in FIG. 1 along the procedure illustrated in FIG. 5.

In the example of FIG. 4, first, through a gate (not illustrated) placed in a side wall part of the base chamber 11 surrounding the process chamber 1 in the horizontal direction, the gate being provided as a conveyance inlet through which the wafer 2 is carried in and out from the process chamber 1, the wafer 2 placed on a distal end part of a wafer conveyance machine such as a robot arm provided in a depressurized space inside another vacuum chamber (not illustrated) placed adjacent to the base chamber 11 is carried into a part above the wafer stage 3 inside the process chamber 1 and transferred onto distal ends of three or more pins projecting upward from the upper surface of the wafer stage 3. After the robot arm leaves the process chamber 1 and the gate is closed airtightly, the wafer 2 is placed on the plurality of protrusions 56 via a gap between the wafer 2 and the upper surface of the wafer stage 3 by the pins being retracted and stored inside the wafer stage 3.

After that, Ar gas is supplied into the process chamber 1 from above via the massflow controller 50, the gas distributor 51, and further the shower plate 23, so that the Ar gas is supplied into a gap between the back surface of the wafer 2 and the wafer stage 3, between the wafer stage 3 and the wafer 2. Hereby, heat transfer between the wafer 2 and the wafer stage 3 including the flow path 39 is promoted, so that the temperature of the wafer 2 approaches asymptotically to the temperature of the wafer stage 3 that is close to the temperature of the refrigerant flowing through the flow path 39, and thus, a step of wafer cooling illustrated in S401 in FIG. 4 is performed. The refrigerant flowing through the flow path 39 is set, by the chiller 38, to have a temperature lower than the temperature of the wafer 2 during the etching process and is supplied to the flow path 39 to circulate therethrough.

Subsequently, as step S402, Ar gas to dilute HF gas in a subsequent step is adjusted in flow rate by the massflow controller 50 and is adjusted in distribution by the gas distributor 51, and further, the Ar gas is supplied into the process chamber 1 from above via the shower plate 23. In the present embodiment, the started supply of Ar gas 52 for dilution may be continued until the end point of the etching process on the silicon oxide film as a process target on the upper surface of the wafer 2 is determined, the supply of the Ar gas 52 may be stopped in the middle, or the Ar gas 52 may be supplied and stopped repeatedly (intermittently) several times. Further, as diluent gas, other inert gases, e.g., $N_2$ gas, can be used instead of the Ar gas.

Note that, in the present embodiment, after the wafer 2 is conveyed into the process chamber 1 but before the etching is ended, gas containing an OH group, e.g., water ($H_2O$), alcohol (CxHyOH), or the like, is not supplied into the process chamber 1.

Subsequently, as step S403, in a state where the wafer 2 is supported by the upper surface of the wafer stage 3, HF gas the flow rate of which is adjusted to a predetermined value by the massflow controller 50 is supplied to the process chamber 1 via the shower plate 23 only for a predetermined period of time. The supplied HF gas reaches the surface of the silicon oxide film 203 on the surface of the wafer 2, HF reacts with silicon oxide ($SiO_2$), and the silicon oxide is removed, and thus, etching on the silicon oxide film 203 is performed. As will be described blow, since the value of the upper limit or the lower limit of the etching rate of the silicon oxide film 203 or a temperature range where the etching is performable varies depending on the partial pressure of the HF gas, when the flow rate of the HF gas, the flow rate of gas for dilution, or the pressure of the process chamber 1 is adjusted to a desirable value, the etching rate of the silicon oxide film 203 can be increased or decreased.

Further, in the present embodiment, as the addition amount of inert gas such as Ar or $N_2$ to be used as the diluent gas to be added to the HF gas is larger, the etching rate of the silicon oxide film 203 tends to decrease. In view of this, the etching rate of the silicon oxide film 203 may be adjusted by adjusting the supply amount of the inert gas as the diluent gas.

In the present embodiment, the pressure of the process chamber 1 during step S403 is desirably a value within a range from 10 Pa to 2000 Pa. The value is particularly desirably between 100 Pa and 1000 Pa. As will be described later, as the pressure is higher, the etching rate of the silicon oxide film is higher, and the temperature at which etching occurs slightly becomes higher.

After the supply of the HF gas in step S403 is performed only for the predetermined period of time, the supply of the HF gas to the process chamber 1 is stopped by the operation of a flow control device in the gas distributor 51 (step S404). During the step, the opening degree of the pressure adjustment valve 14 and the rotation number of a turbomolecular pump in the gas discharge pump 15 are adjusted to be equivalent to those in step S403, and when the supply of the HF gas into the process chamber 1 stops, the HF gas remaining in the gas phase inside the process chamber 1 is discharged to outside the process chamber 1 through a gas discharge port or the evacuation pipe 16 together with reaction products formed inside process chamber 1 or particles of other gases, so that the process chamber 1 is depressurized. During the discharging of gas or after the discharging of gas, the temperature of the wafer 2 that is a temperature increased by the etching in S403 can be cooled to be close to the wafer stage 3 by supplying Ar gas as the diluent gas into the process chamber 1.

Further, subsequently after step S404, a step of postprocessing on the wafer 2 may be performed. In the etching process illustrated in this figure, an OH-group containing component such as alcohol or water is not introduced, but it is considered that the aforementioned reaction occurs due to a very small amount of water contained in the silicon oxide film 203 targeted for the etching or a very small amount of water contained in the surface of the member made of quartz, the surface facing the process chamber 1 of the etching processing apparatus 100, as described above. Further, during the etching, it is assumed that HF aggregates on the surface of the silicon oxide film 203 or the film structure including the silicon oxide film 203 and liquefies or furthermore solidifies, and therefore, at the time of the end of the etching, a heating step of efficiently removing the HF thus aggregating, liquefying, or solidifying can be added.

FIG. 5 illustrates a procedure obtained by adding a step (S505 in FIG. 5) of heating the wafer 2 and a step (S506) of subsequently cooling the wafer 2 are added to the procedure illustrated in FIG. 4. Steps S501 to S504 illustrated in this figure are the same as steps S401 to S404 in the flowchart illustrated in FIG. 4.

When, in step S505, the electromagnetic wave from the IR lamp 60 to the wafer 2 is detected for a predetermined period of time or a state where the temperature of the wafer 2 or the wafer stage 3 has a predetermined value is detected based on output from a temperature sensor (not illustrated), and step S505 is ended, step S506 is started to cool the wafer, and hereby, the etching process is ended.

Note that, after a control unit determines that the wafer 2 is heated for a predetermined period of time or to a predetermined temperature in step S505, the operation of the IR lamp 60 is stopped, and step S505 is ended. After that, in a state where the supply of the refrigerant having a predetermined temperature to the flow path 39 inside the wafer stage 3 and the supply of Ar gas to between the wafer 2 and the wafer stage 3 are maintained, step S506 of cooling the wafer 2 is performed. After the cooling of the wafer 2 is continued until a controller detects the arrival of the predetermined period of time or the predetermined temperature, step S506 is stopped, and hereby, the steps of the etching process on the silicon oxide film 203 of the wafer 2 are ended.

In the example of this figure, the IR lamp unit 60 including the IR (infrared) lamps 60-1, 60-2, 60-3 illustrated in FIG. 1 is used for heating of the wafer 2 in step S505. Along with the start of step S505, electric power from the lamp power supply 73 is supplied to the lamps 60-1, 60-2, 60-3 in response to a command signal from the controller (not illustrated), and the electromagnetic wave including the infrared region is applied onto the wafer 2. The steps of heating and cooling of the wafer 2 may be performed after a set of steps S501 to S504 is repeated several times until a predetermined amount of etching on the silicon oxide film 203 is obtained or may be performed in at least one cycle, as one step of a set (cycle) of steps to be performed subsequently to steps S501 to S504.

The configuration for heating is not limited to this, and for example, a method of heating the wafer stage 3 and the wafer 2 placed on the wafer stage 3 by a heater placed inside the wafer stage 3, or a method of conveying the wafer 2 to a device configured to perform only heating and heating the wafer 2 may be employed. Further, at the time when the electromagnetic wave is emitted from the IR lamp unit 60, inert gas such as Ar gas or nitrogen gas can be introduced into the process chamber 1. Further, the heating to remove an attached substance or a deposit may be performed several times as needed, or in a case where the amount of the attached substance or the deposit is determined to fall within an allowable range, steps S505, S506 for heating and cooling may not be performed.

Further, as the postprocessing to remove a deposit or a residual substance after the etching, the removal may be performable such that the wafer 2 is conveyed to outside the process chamber 1 and subjected to washing with water, instead of heating in vacuo. Further, cleaning treatment in which an attached substance on the surface is removed by being detached and volatilized by use of $O_2$ plasma formed inside the process chamber 1 can be used.

Further, at the time of the etching in the present embodiment, a deposit may be formed on the surfaces of the silicon nitride films 202 or the side wall or the surface of the film structure in which the side wall of the groove or the hole is constituted by respective end parts of the film layers formed by laminating the silicon oxide films 203 such that they are each sandwiched between the silicon nitride films in the up-down direction. As a result of analysis by a total reflection infrared absorption spectrum, it was found that the deposit is ammonium fluorosilicate.

Ammonia (NHx) is not used in the etching process in the present embodiment, but when the silicon nitride film 202 is partially etched, ammonia may be generated from nitrogen in a nitride film, and ammonium fluorosilicate $(NH_4)_2SiF_6$ may be generated. It is known that the ammonium fluorosilicate as the deposit decomposes at 145° C., from data such as Safe Data Sheet. From this, it is effective to perform the step of heating the wafer 2 heats in vacuo after the etching to remove ammonium fluorosilicate generated as a deposit.

FIG. 6 is a time chart illustrating the procedure of operations at the time when the etching processing apparatus according to the embodiment illustrated in FIG. 1 performs the etching process of the flowchart illustrated in FIG. 5. In FIG. 6, steps S501 to S504 are the same as those illustrated in FIG. 4. In a case where steps S501 to S504 are steps performed under a condition for the process on the wafer 2 that does not require the step of heating the wafer 2 after those steps, the steps of heating and cooling, illustrated in the time chart of FIG. 6, may be omitted.

That is, similarly to the examples in FIGS. 4, 5, after the untreated wafer 2 is conveyed into the process chamber 1, placed on the upper surface of the wafer stage 3, adsorbed onto the surface of a dielectric film on the upper surface of the wafer stage 3, and held in that state, Ar gas having a heat transfer property is supplied into the process chamber 1, the Ar gas is introduced into a gap between the back surface of the wafer 2 supported on the distal ends of the protrusions 56 on the wafer stage 3 and the upper surface of the wafer mounting surface of the wafer stage 3, and heat conduction between the wafer 2 and the wafer stage 3 is promoted (step S501). In the present embodiment, the temperature of the refrigerant to be supplied to the flow path 39 and the supply of gas for heat transfer are adjusted so that the temperature of the wafer 2 has a value falling within a predetermined range (described later).

Subsequently, as step S502, the Ar gas 52 to dilute HF gas is supplied into the process chamber 1 from its upper side. The flow rate of the Ar gas supplied in step S502 may be smaller than the flow rate in step S501. Subsequently, in a state where the temperature of the wafer 2 is maintained at a value within a desired range, HF gas is supplied to the process chamber 1 at a predetermined flow rate only for a predetermined period of time, and hereby, etching is performed such that silicon oxide is removed by the reaction between the HF gas thus supplied and the silicon oxide film on the surface of the wafer 2 (step S503).

After step S503 is performed for a predetermined period of time, the supply of the HF gas to the process chamber 1 is stopped, particles of the HF gas remaining in the gas phase in the process chamber 1, a reaction product formed inside the process chamber 1, or other gases are discharged to outside the process chamber 1, so that the process chamber 1 is depressurized (step S504). The supply of the Ar gas to the process chamber 1 may be stopped during step S504.

When, in step S505, the electromagnetic wave from the IR lamp 60 to the wafer 2 is detected only for a predetermined period of time, or a state where the temperature of the wafer 2 or the wafer stage 3, detected from output from a temperature sensor (not illustrated), has a desired value is detected, and step S505 is ended, step S506 is started to cool the wafer, and then, the etching process is ended.

The etching process in the present embodiment can be also performed by repeating the process illustrated in FIG. 5. In this case, the steps illustrated in FIG. 6 are repeated only a necessary number of times. For example, in a case where a lot of deposits are formed in the previously described etching, when a short-time etching step illustrated in step S403 or S503 is performed and removal by heating the wafer 2 in vacuo in step S505 is repeated, the deposits can be removed more easily.

(Etching Result—1)

FIGS. 7A to 11B illustrate results obtained by supplying HF gas into the process chamber 1 and performing the etching process on the silicon oxide film and the silicon nitride film formed in advance on the wafer 2 under conditions of a plurality of temperatures, pressures, and so on in the etching processing apparatus 100 according to the present embodiment. FIGS. 7A to 11B are graphs each illustrating an example of changes in etching speed over changes in film temperature in a case where respective single layer films of the silicon oxide film and the silicon nitride film were etched by use of hydrogen fluoride gas in the etching processing apparatus 100 according to the embodiment illustrated in FIG. 1.

In the etching processes, the temperature of the wafer 2 was set to a plurality of values in a range from −10° C. to −40° C., respective single layer films of the silicon oxide film and the silicon nitride film formed in advance on the wafer 2 by plasma CVD were subjected to the etching process, and respective etching rates were detected. More particularly, prior to the detection of the process results, first, in order to set the temperature of the wafer 2 to a value within a range suitable for the process, Ar gas was supplied at a flow rate of 1.0 L/min for 60 seconds while the pressure in the process chamber 1 was maintained at 900 Pa. Then, after the pressure in the process chamber 1 was set to a predetermined pressure, process gas for etching was supplied into the process chamber 1. In the present embodiment, as the type of the process gas used for etching and the flow rate of the process gas, HF (hydrogen fluoride) gas was supplied at 0.40 L/min, and further Ar gas as the diluent gas was supplied at 0.20 L/min.

Further, in the present embodiment, the flow rates of the HF gas and the Ar gas were fixed, and the etching process was performed for 120 s. The value of the pressure (total pressure) in the process chamber 1 during the etching process was varied to a plurality of different values to perform the process, and obtained results were compared and examined.

After the etching was ended, in a state where the setting of the temperature of the refrigerant to be supplied to the flow path 39 was maintained to the setting in a previous step, the process chamber 1 was depressurized for 20 seconds to discharge gas while inert gas (Ar gas) was supplied into the process chamber 1, and after that, while the Ar gas was supplied into the process chamber 1 at a flow rate of 0.50 L/min in a state where the opening degree of the pressure adjustment valve 14 was set to 100%, a predetermined amount of electric power was supplied to the IR lamps 60-1, 2, 3, so that the electromagnetic wave was applied to the wafer 2 for 50 seconds to heat the wafer 2. The highest temperature of the wafer 2 in the step of heating was about 250° C. After that, the supply of electric power to the IR lamp 60-1, 2, 3 was stopped, and cooling was performed for 120 seconds in a state where the Ar gas was supplied into the process chamber 1 at a flow rate of 1.0 L/min and flowed with the pressure (total pressure) in the process chamber 1 being 900 Pa.

A of each of FIGS. 7A to 11A illustrates changes in the etching rate over changes in the wafer temperature at each value of the different pressures (total pressures) of the process chamber 1 during the etching process. Further, B of each of FIGS. 7A to 11B illustrates changes in the ratio of the etching rate of the silicon oxide film to that of the silicon nitride film as a selection ratio over changes in the wafer temperature. As the values of the pressure (total pressure) during the etching process, 300 Pa, 600 Pa, 800 Pa, 900 Pa, and 990 Pa are respectively illustrated FIGS. 7A to 11B. Note that the partial pressures (pp) of the HF gas with respect to the values of the total pressure, illustrated in respective figures, are 200 Pa, 400 Pa, 533 Pa, 600 Pa, and 660 Pa.

As illustrated in these figures, as a result of the examination, it was found that, as the pressure in the process chamber 1 during the etching process increases, the etching rate (its absolute value) of the silicon oxide film increases, and the upper limit of a temperature range for the wafer during the process in which the etching rate is large also becomes higher. Further, it was found that the temperature range where the etching rate is large also becomes wider.

Upper limits of the temperature range for the etching on the silicon oxide film are summarized in Table 1.

TABLE 1

Pressure and flow rate in etching and maximum temperature in etching on silicon oxide film

Figure 7A:
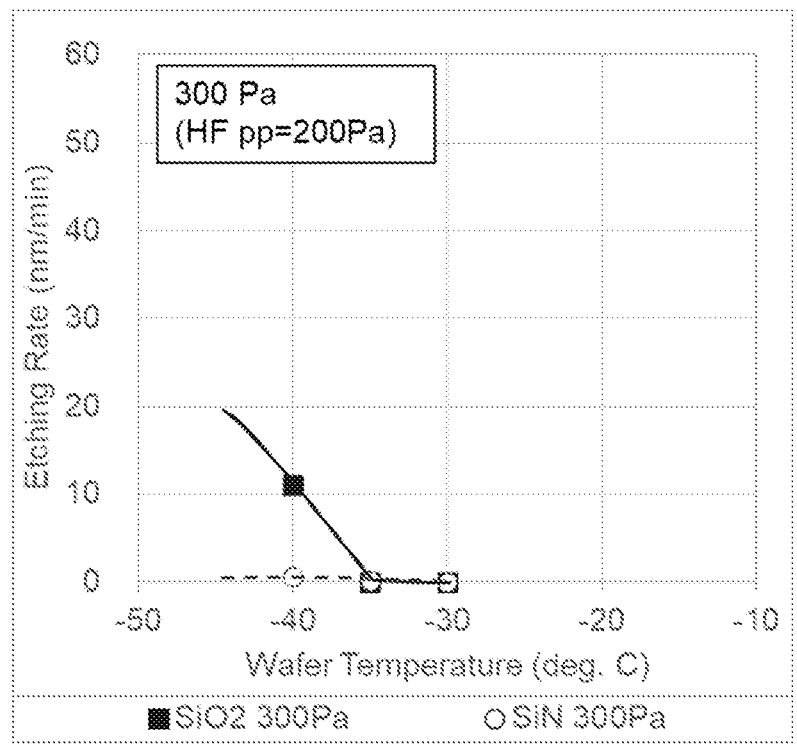
FIGS. 7A and 7B are graphs illustrating examples of changes in etching speed over changes in film temperature in a case where respective single layer films of a silicon oxide film and a silicon nitride film were etched by use of hydrogen fluoride gas based on an etching processing method according to the embodiment of the present invention.
Figure 7B:
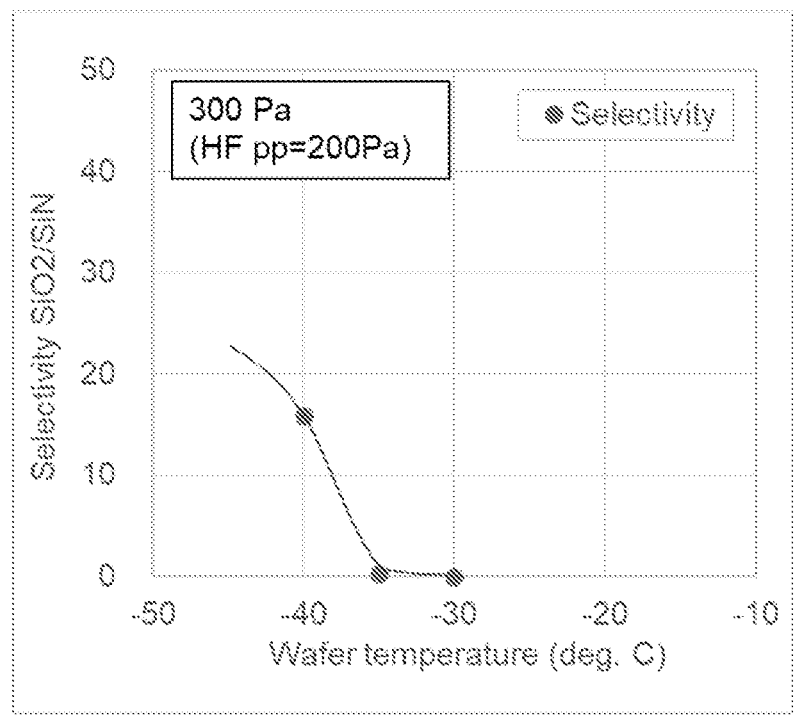
Figure 8A:
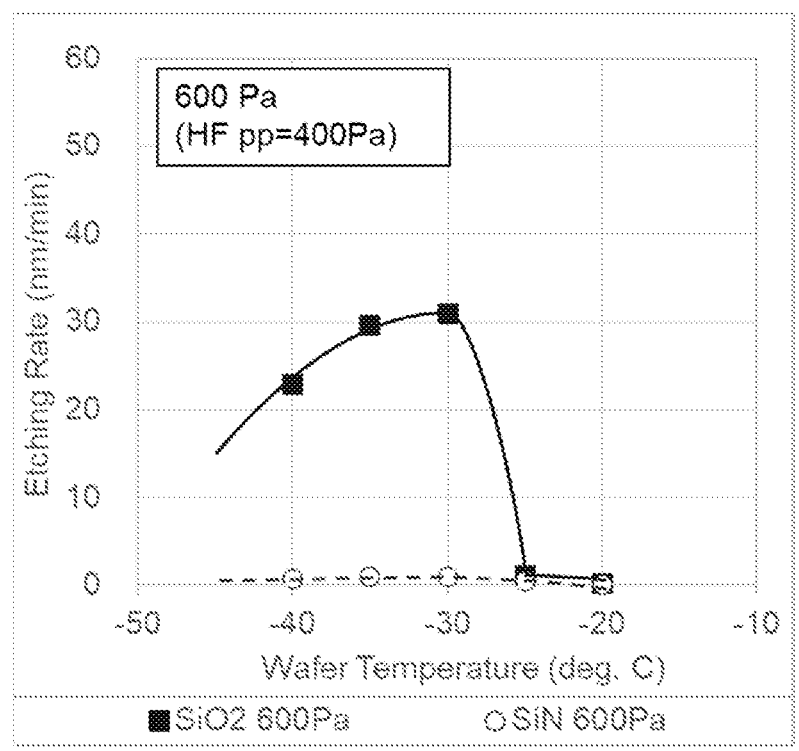
FIGS. 8A and 8B are graphs illustrating examples of changes in etching speed over changes in film temperature in a case where respective single layer films of the silicon oxide film and the silicon nitride film were etched by use of hydrogen fluoride gas based on the etching processing method according to the embodiment of the present invention.
Figure 8B:
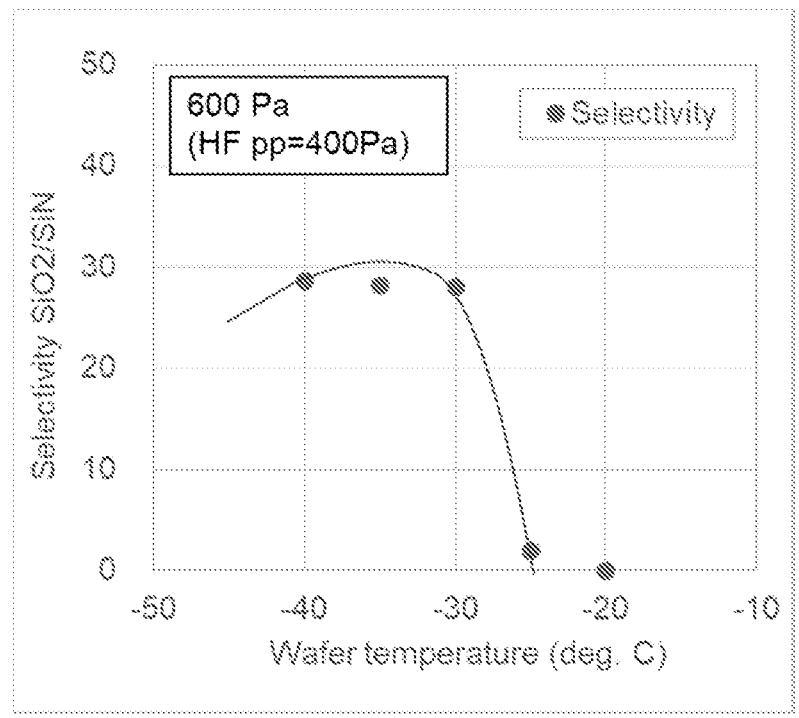
Figure 9A:
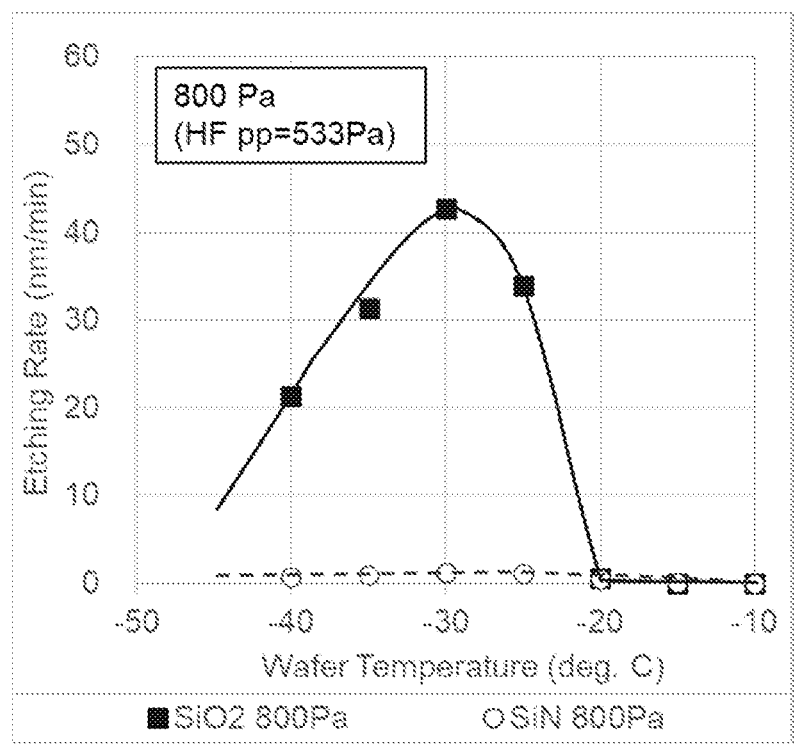
FIGS. 9A and 9B are graphs illustrating examples of changes in etching speed over changes in film temperature in a case where respective single layer films of the silicon oxide film and the silicon nitride film were etched by use of hydrogen fluoride gas based on the etching processing method according to the embodiment of the present invention.
Figure 9B:
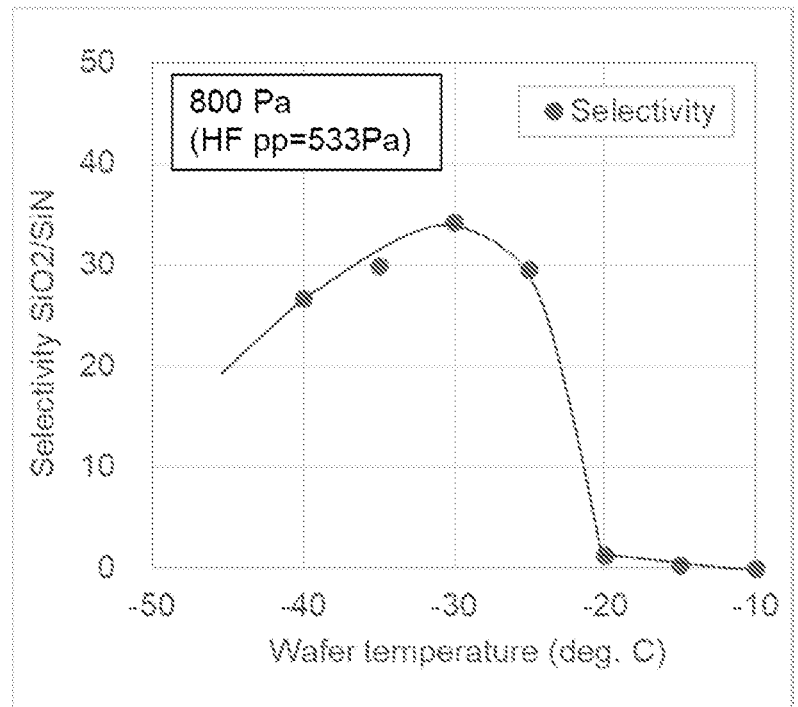
Figure 10A:
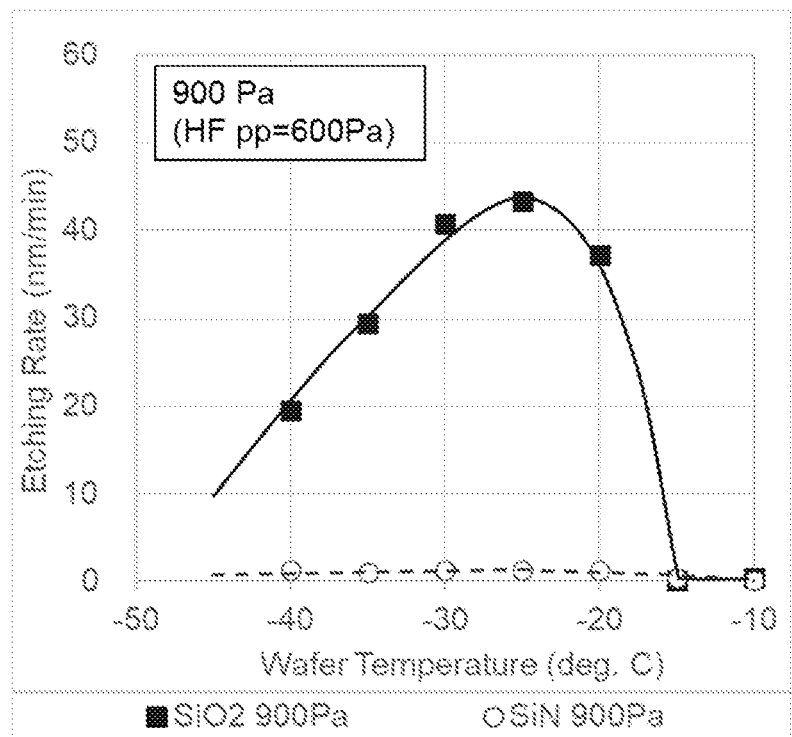
FIGS. 10A and 10B are graphs illustrating examples of changes in etching speed over changes in film temperature in a case where respective single layer films of the silicon oxide film and the silicon nitride film were etched by use of hydrogen fluoride gas based on the etching processing method according to the embodiment of the present invention.
Figure 10B:
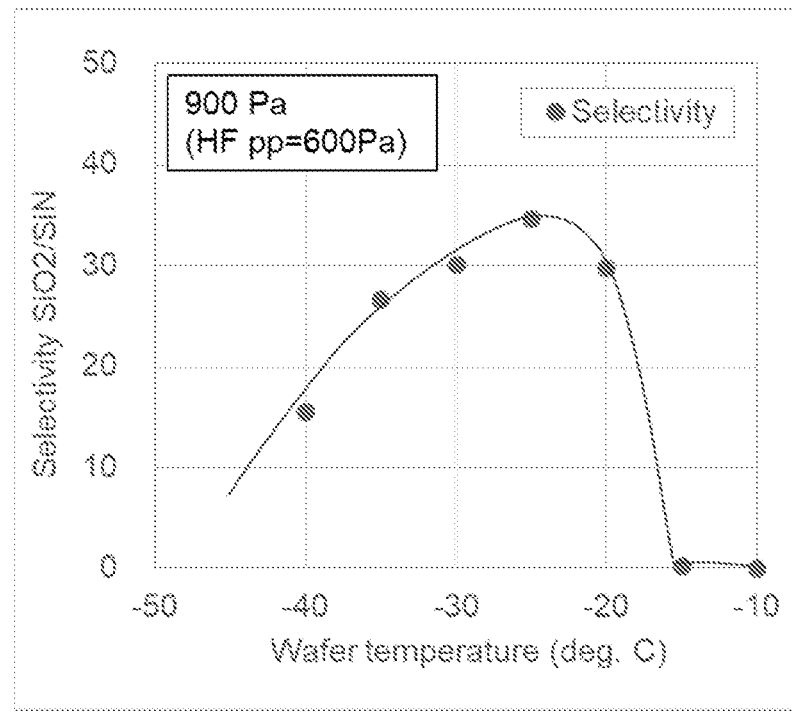
Figure 11A:
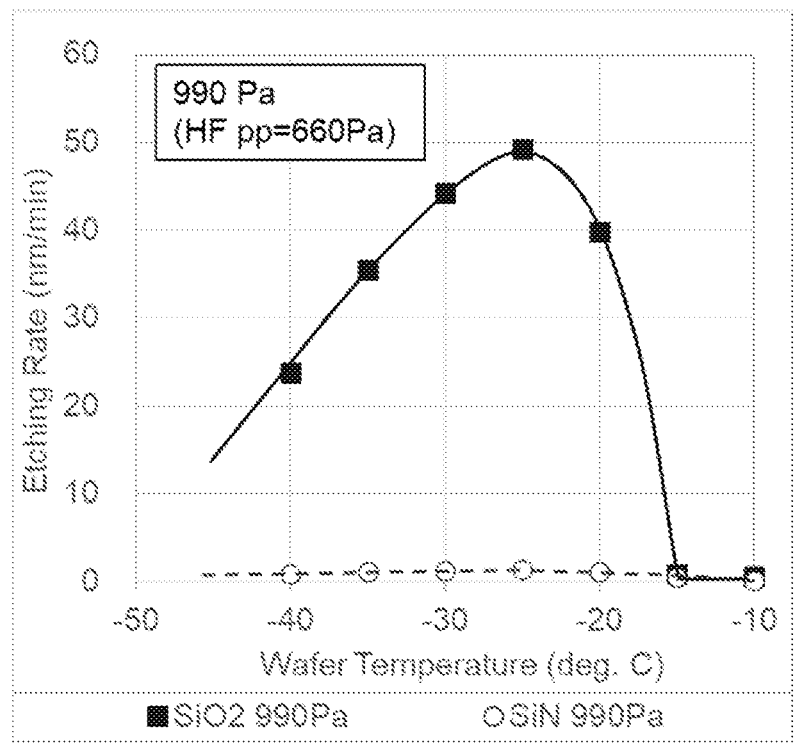
FIGS. 11A and 11B are graphs illustrating examples of changes in etching speed over changes in film temperature in a case where respective single layer films of the silicon oxide film and the silicon nitride film were etched by use of hydrogen fluoride gas based on the etching processing method according to the embodiment of the present invention.

| Total pressure (Pa) | 300 | 600 | 800 | 900 | 990 |
|---|---|---|---|---|---|
| HF (L/min) | 0.40 | 0.40 | 0.40 | 0.40 | 0.40 |
| Ar (L/min) | 0.20 | 0.20 | 0.20 | 0.20 | 0.20 |
| HF partial pressure (Pa) | 200 | 400 | 533 | 600 | 660 |
| Maximum temperature (° C.) | −35 | −25 | −20 | −15 | −15 |
| Resultant graph | FIG. 7A | FIG. 8A | FIG. 9A | FIG. 10A | FIG. 11A |

As illustrated in Table 1 and A of each of FIGS. 7A to 11A, in any of the cases, the etching rate of the silicon nitride film was a value around 1 nm/min or less than that, and even when the pressure in the process chamber 1 was increased, an increase in the etching rate from the value around 1 nm/min was not observed. Further, as illustrated in B of each of FIGS. 7B to 11B, it was found that the selection ratio as the ratio of the etching rate of the silicon oxide film to that of the silicon nitride film improves as the pressure in the process chamber 1 increases, and the temperature range of the wafer where the selection ratio is 20 or more becomes wider.

From the above results, it is found that, in order to etch the silicon nitride film at a high selection ratio with respect to the silicon oxide film at a relatively high etching rate of the silicon oxide film and a relatively low etching rate of the silicon nitride film, it is necessary to select a value within an appropriate temperature range for the wafer in accordance with the pressure to be used. More specifically, it was found that the temperature range for the wafer is as follows.

In a case where the pressure (total pressure) of the atmosphere around the wafer during etching is 300 Pa (the HF partial pressure is 200 Pa), the temperature of the wafer is from −35° C. to −60° C., more desirably from −35° C. to −50° C. Further, in a case where the total pressure is 600 Pa (the HF partial pressure is 400 Pa), the wafer temperature is from −25° C. to −60° C., more desirably from −25° C. to −50° C. In a case where the total pressure is 800 Pa (the HF partial pressure is 533 Pa), the wafer temperature is from −20° C. to −60° C., more desirably from −20° C. to −50° C. Further, in a case where the total pressure is 900 Pa (the HF partial pressure is 600 Pa), the temperature is from −15° C. to −60° C., more desirably from −15° C. to −50° C. Further, in a case where the total pressure is 990 Pa (the HF partial pressure is 660 Pa), the wafer temperature is from −15° C. to −60° C., more desirably from −15° C. to −50° C. From this, it is apparent that the temperature range should be selected in a range corresponding to the total pressure from 900 Pa to 990 Pa (the HF partial pressure is from 600 Pa to 660 Pa).

It is considered that, even when the temperature of the wafer is from −50° C. to −60° C., the silicon oxide film can be etched. However, particularly in a case where the pressure is high, the etching rate of the silicon oxide film tends to decrease, and in order to obtain such a low temperature, it is necessary that the wafer or the processing apparatus have durability to a lower temperature, and therefore, it is considered that the temperature of the wafer is more desirably equal to or more than −50° C.

Further, the inventors performed, with the use of the etching processing apparatus 100, the etching process on the silicon oxide film 203 in the film structure in which the silicon oxide film 203 and the silicon nitride film 202 were laminated as illustrated in FIG. 2A, under the pressure conditions illustrated in Table 1 and at different temperatures of the wafer. At temperatures higher than respective temperatures exhibited in the maximum temperature in Table 1 with respect to respective values of the pressure in the process chamber 1, the etching hardly advanced as expected. Further, when the temperature is lowered excessively, the amount of etching tends to become small.

In conclusion, as a result of the etching, the condition of the temperature and the pressure at which a desired shape after machining as illustrated in FIG. 2B was obtained is as follows. That is, when the total pressure as the pressure inside the process chamber 1 was 300 Pa (the HF partial pressure was 200 Pa), the wafer temperature was from −35° C. to −50° C., when the total pressure was 600 Pa (the HF partial pressure was 400 Pa), the wafer temperature was from −25° C. to −50° C., and when the total pressure was 800 Pa (the HF partial pressure was 533 Pa), the wafer temperature was from −20° C. to −50° C. Further, when the total pressure was 900 Pa (the HF partial pressure was 600 Pa), the wafer temperature was from −15° C. to −50° C., and when the total pressure was 990 Pa (the HF partial pressure was 660 Pa), the wafer temperature was from −15° C. to −50° C. Further, it was observed that, by performing the step of heating the wafer after the etching, a residual substance or the like on the surface of a processed film was reduced, and the accuracy of machining improved.

Embodiment 2

(Etching Processing Apparatus—2)

Figure 12:
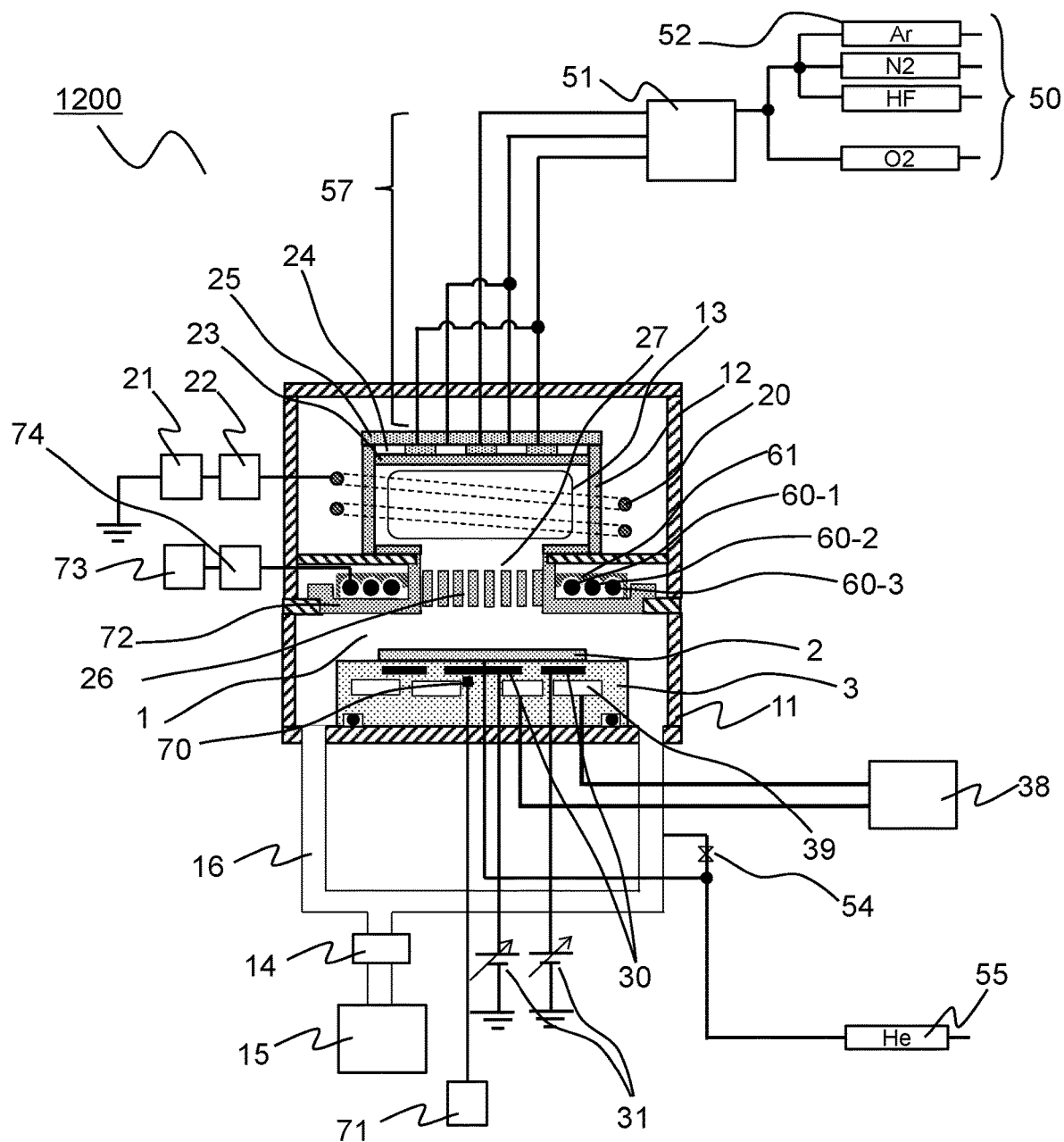
FIG. 12 is a longitudinal sectional view schematically illustrating an outline of a configuration of an etching processing apparatus according to an alternative embodiment of the present invention.

With reference to FIG. 12, the following describes an outline including a whole configuration of an etching processing apparatus according to an alternative embodiment of the present invention. FIG. 12 is a longitudinal sectional view schematically illustrating an outline of the configuration of the etching processing apparatus according to the alternative embodiment of the present invention.

An etching processing apparatus 1200 illustrated in this figure is different from the configuration of the etching processing apparatus 100 of the embodiment illustrated in FIG. 1 in that a plasma source communicating with the process chamber 1 via a flow path 27 having a cylindrical shape is placed above the base chamber 11 in which the process chamber 1 and the wafer stage 3 are provided, and that an electrostatic adsorption electrode 30 configured to cause the wafer 2 to be electrostatically adsorbed onto the upper surface of the wafer stage 3, and an electrostatic adsorption DC voltage source 31 configured to supply direct-current power to the electrostatic adsorption electrode 30 are provided inside the wafer stage 3, but the protrusions 56 are not provided. In the etching processing apparatus 1200 according to the present embodiment, a quartz chamber 12 placed above a central part of the base chamber 11 and connected to the base chamber 11 such that the quartz chamber 12 internally communicates with the base chamber 11 to constitute a vacuum chamber similarly to the base chamber 11, and a configuration to form plasma by use of gas for process, supplied to a space inside the quartz chamber 12, include a plasma source including a coil to which electric power is supplied, and a power supply for the electric power. The space inside the quartz chamber 12 communicating with the process chamber 1 is used as the plasma source for cleaning of an inner wall of the vacuum chamber by particles having high reactivity in plasma or generation of gas having high reactivity.

The plasma source is configured such that the quartz chamber 12 having a cylindrical shape and made of a dielectric such as quartz to form ICP (inductively coupled plasma) inside the quartz chamber 12 is placed above the base chamber 11 to sandwich the IR lamp unit. An ICP coil 20 as a coil for forming a high-frequency electric field by receiving high-frequency power for plasma formation is placed such that the IPC coil 20 is wound in a plurality of steps in the up-down direction around an outer wall of the quartz chamber 12.

A high frequency source 21 is electrically connected to the ICP coil 20 via a matching device 22. A frequency band of dozens of megahertz is used as the frequency of the high-frequency power, and in the present embodiment, the frequency of the high-frequency power is 13.56 MHz. A disk-shaped top plate 25 is placed above an upper end of a side wall of the quartz chamber 12, and a seal such as an O-ring is sandwiched therebetween to connect them such that the seal airtightly separates a discharge chamber having a cylindrical shape inside the quartz chamber 12 from external atmosphere around the etching processing apparatus 1200.

Similarly to the etching processing apparatus 100 illustrated in FIG. 1, a plurality of gas introduction tubes 57 through which process gas or inert gas passes, the plurality of gas introduction tubes 57 serving as ducts for gas supply, is connected to the top plate 25. A gas distribution plate 24 and the shower plate 23 below the gas distribution plate 24 are placed below the top plate 25, the gas distribution plate 24 and the shower plate 23 having a circular plate shape and having a plurality of through-holes in the up-down direction. The process gas or the inert gas supplied through the gas introduction tubes 57 is dispersed through the through-holes of the gas distribution plate 24 and the shower plate 23 and introduced downward into the quartz chamber 12 from its upper side.

Similarly to the embodiment in FIG. 1, the flow rates of gases to be supplied are adjusted by respective massflow controllers 50 provided for respective types of the gases. Further, the gas distributor 51 is provided on the downstream side from the massflow controllers 50 and is configured to independently adjust respective values of the flow rates and the compositions of gas to be supplied to the vicinity of the center of the quartz chamber 12 and gas to be supplied to the vicinity of the outer periphery of the quartz chamber 12, and hereby, the distribution of partial pressures of various types of gases in the quartz chamber 12 is adjusted. Note that, in FIG. 12, Ar, $N_2$, HF, $O_2$ are described as gases to be supplied into a container, but other gases may be used as needed.

The gas for process, introduced into a space having a cylindrical shape and surrounded by the quartz chamber 12 and the top plate 25, is excited by a high-frequency induction field formed by an induction field formed by high-frequency power supplied to the ICP coil 20 and is ionized and dissociated to form plasma. That is, the space having a cylindrical shape is the discharge chamber.

The flow path 27 having a cylindrical shape is placed in the center of the IR lamp unit below the discharge chamber and further communicates with an upper part of the process chamber 1 placed below. Inside the flow path 27, a slit plate 26 as a circular plate made of a material made of a dielectric and having permeability, e.g., quartz or the like, and having a plurality of through-holes having a predetermined sectional shape in the up-down direction is placed. The plane shape of the through-holes is not limited to a slit shape and may be a rectangular shape, a circular shape, or an oval shape. The through-holes of the slit plate 26 block charged particles having high energy such as ions or electrons, formed in plasma formed in the discharge chamber, and the through-holes allow active species (radicals) or neutral gas particles to pass therethrough and enter the process chamber 1 placed below.

Further, in the etching processing apparatus 1200 of the present embodiment, a dielectric film constituting an upper surface on which the wafer 2 is placed is placed on an upper surface of a metal member of the wafer stage 3. Inside the dielectric film, a plurality of film-shaped electrostatic adsorption electrodes 30 to which direct-current power to fix the wafer 2 by electrostatic adsorption is supplied is provided. Further, respective electrostatic adsorption DC voltage sources 31 are electrically connected to respective electrostatic adsorption electrodes 30 such that direct-current power is supplied to the respective electrostatic adsorption electrodes 30 during the process on the wafer 2 to give a desired polarity to generate static electricity inside the dielectric film.

Further, the back surface of the wafer 2 is generally adsorbed to the upper surface of the dielectric film on the mounting surface of the wafer stage 3. In order to efficiently adjust the temperature of the wafer 2 to a value in a range suitable for the process, a supply port via which gas having thermal conductivity such as He is supplied is placed on the upper surface of the dielectric film on the upper surface of the wafer stage 3, and He gas is supplied between the back surface of the wafer 2 and the dielectric film in a state where the wafer 2 is placed on the dielectric film on the wafer stage 3, so that heat transfer between the wafer 2 and the flow path 39 is promoted. Note that the dielectric film in the present embodiment is made of resin such as polyimide to restrain the back surface of the wafer 2 from being damaged even when the wafer 2 is heated or cooled in a state where the wafer 2 is electrostatically adsorbed.

Further, the processing apparatus of the present embodiment can warm the inside of the vacuum chamber such as the process chamber to be exposed to hydrogen fluoride gas, other than the wafer stage 3. For example, the wall surface of the base chamber 11 can be maintained at a temperature between 40° C. to 120° C. Hereby, it is possible to prevent particles of gas such as hydrogen fluoride or generated products from being adsorbed to an inner wall surface of the process chamber 1, thereby making it possible to inhibit corrosion inside the chamber.

(Procedure of Etching Process—2)

Figure 13:
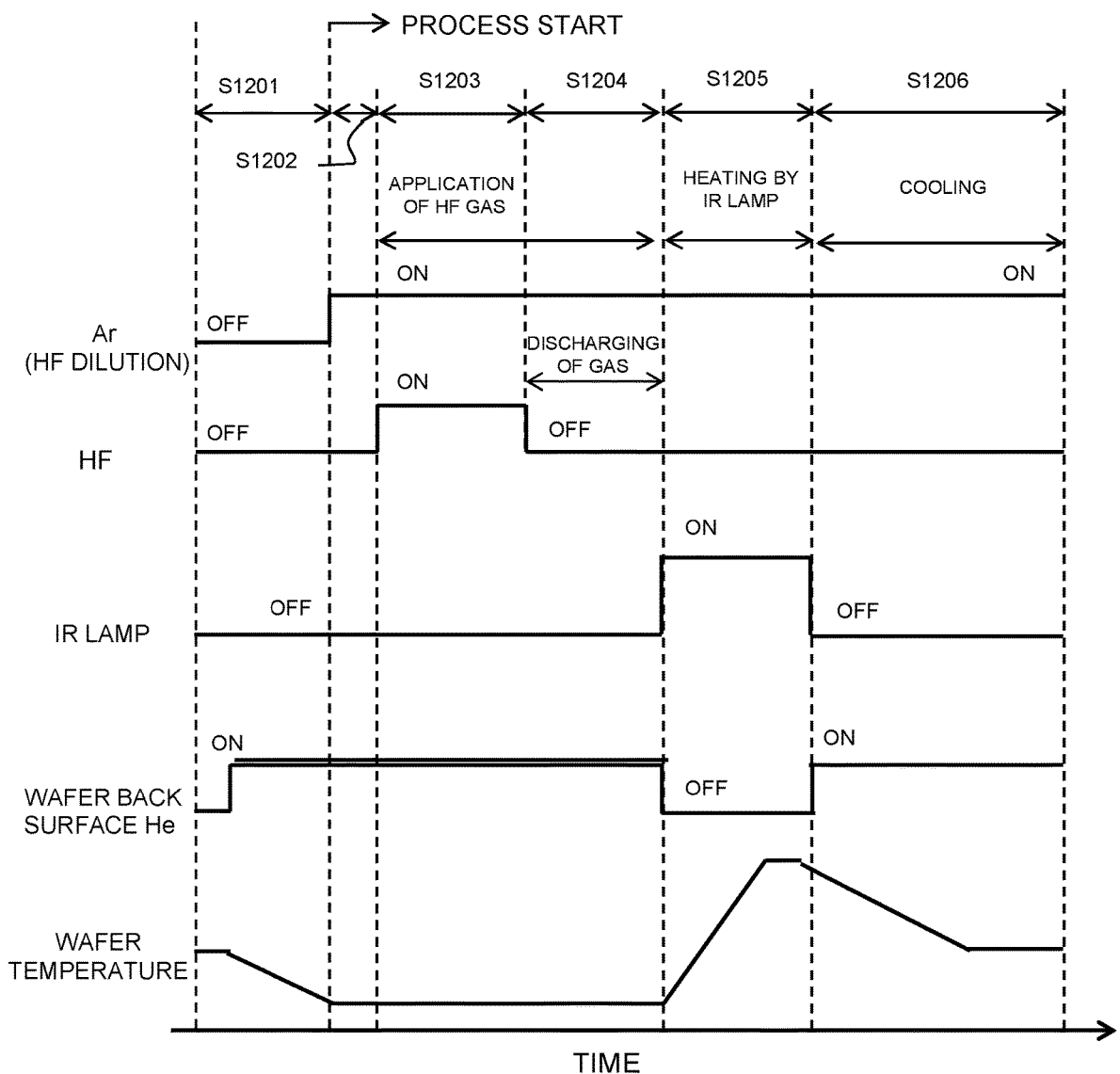
FIG. 13 is a time chart illustrating the procedure of operations to process a wafer by the etching processing apparatus according to the alternative embodiment of the present invention illustrated in FIG. 12.

Next will be described etching on the wafer 2 to be performed by the etching processing apparatus 1200 according to the alternative embodiment illustrated in FIG. 12, with reference to FIG. 13. FIG. 13 is a time chart illustrating the procedure of operations for the etching processing apparatus 1200 according to the alternative embodiment of the present invention illustrated in FIG. 12 to process a wafer.

In FIG. 13, first, the wafer 2 before the process is placed on a distal end of an arm of a conveyance device such as a robot arm (not illustrated), conveyed into the process chamber 1 through a conveyance inlet (not illustrated) provided in the process chamber 1, and transferred onto a plurality of pins projecting upward from the wafer stage 3, similarly to the embodiment illustrated in FIG. 4 or 5, and after that, the wafer 2 is placed on the dielectric film constituting the mounting surface of the wafer stage 3 by the pins being retracted and stored inside the wafer stage 3. When the conveyance inlet is sealed after the robot arm leaves the process chamber 1, electric power is supplied to the electrostatic adsorption electrodes 30 by the electrostatic adsorption DC voltage sources 31 for electrostatic adsorption, and the wafer 2 is held by being adsorbed onto the dielectric film, and after that, He gas for cooling or heat transfer enhancement is supplied to the back surface of the wafer 2, so that the temperature of the wafer 2 decreases to approach a temperature set to the refrigerant flowing through the flow path 39 of the wafer stage 3 (step S1201).

Subsequently, as step S1202, Ar gas to dilute HF gas is supplied into the process chamber 1 via the shower plate 23 such that the flow rate of the Ar gas is adjusted by the massflow controller 50, and the distribution of the Ar gas is adjusted through the gas distributor 51. From this step until a step (step S1203) of performing the etching process to be performed subsequently is ended, the Ar gas may be kept flowing or the supply of the Ar gas may be stopped in the subsequent step. Further, as the diluent gas, other inert gases, e.g., $N_2$ gas, can be used instead of the Ar gas.

Subsequently, as step S1203, HF gas is supplied into the process chamber 1 at a predetermined flow rate only for a predetermined period of time, so that particles of the HF gas react with the surface of the silicon oxide film 203 on the wafer 2, and hereby, etching similar to step S403, S503 is performed. As will be described later, in the etching process, the partial pressure of the HF gas affects the etching rate of the silicon oxide film 203 and further affects a temperature range in which the etching rate is large. In view of this, by adjusting the partial pressure of the HF gas, a desired etching rate of the silicon oxide film 203 can be obtained.

In the present embodiment, as the supply amount of the inert gas such as Ar or $N_2$ as the diluent gas to be supplied with the HF gas is larger, the etching rate tends to decrease, and therefore, the etching rate can be also adjusted by increasing and decreasing the flow rate of the diluent gas or the flow rate ratio between the diluent gas and the HF gas.

In the present embodiment, the pressure used in the process chamber 1 in step S1203 is desirably from around 10 Pa to 2000 Pa. The pressure is particularly desirably from 100 Pa to 1000 Pa. As will be described later, it is known that, as the pressure of the atmosphere during etching is larger, the etching rate of the silicon oxide film 203 is higher and the temperature range in which the etching rate is large is higher.

After the supply of the HF gas and the etching on the silicon oxide film 203 in step S1203 are performed only for a predetermined period of time, the supply of the HF gas to the process chamber 1 is stopped by the operations of the gas distributor 51 and the massflow controller 50, so that the HF gas remaining in the gas phase in the process chamber 1 is discharged to outside the process chamber 1 (step S1204). In a plurality of steps of the etching process illustrated in this figure, the operation of the gas discharge pump 15 at the same rotation number is maintained, and in step S1204 in which the supply of the HF gas is stopped, the pressure in the process chamber 1 may be reduced from step S1203.

Further, subsequent steps are further performed on the etched film structure in the present embodiment. As described above, it is considered that, during the etching, HF aggregates on the silicon oxide film 203 to liquefy or solidify. In view of this, in the present embodiment, after step S1203, a step (step S1205) of heating the wafer 2 to efficiently remove a residue caused by particles of the HF gas is performed.

In step S1205, the wafer 2 is heated such that the wafer 2 is irradiated with the electromagnetic wave from the IR lamp 60 only for a predetermined period of time or until a state where the temperature of the wafer 2 or the wafer stage 3, detected from output from a temperature sensor (not illustrated), has a desired value is detected. During this step, in order to raise efficiency of the heating of the wafer 2, the supply of gas having a heat transmission property such as He gas to a gap between the wafer 2 and the dielectric film on the upper surface of the wafer stage 3 is stopped.

When the supply of electric power to the IR lamp 60 is specified and step S1205 is ended, step S1206 is started to cool the wafer. Along with the start of step S1206, the supply of gas having a heat transmission property such as He gas to the gap between the back surface of the wafer 2 and the wafer stage 3 is restarted, so that the temperature of the wafer 2 decreases to approach the temperature of the refrigerant flowing through the flow path 39. Thus, step S1206 of cooling the wafer 2 is performed in a state where the supply of the Ar gas into the process chamber 1 is maintained. After the cooling of the wafer 2 is continued until the controller detects the arrival of a predetermined period of time or a predetermined temperature, step S1206 is stopped, and hereby, the steps of the etching process on the silicon oxide film 203 of the wafer 2 is ended.

The heating of the wafer 2 can be performed by use of other means instead of the IR lamp 60, similarly to the embodiment in FIGS. 5, 6. Further, at the time of irradiation from the IR lamp, inert gas such as Ar gas or nitrogen gas may be also supplied into the process chamber 1. Further, the step of heating the wafer 2 in step S1205 may be performed one or more times as needed or may not be performed. The action obtained by performing the step of heating the wafer 2 can be also obtained similarly to the embodiment in FIGS. 5, 6.

Note that, in the present embodiment including the configuration to electrostatically adsorb the wafer 2, when the wafer 2 was carried out from the process chamber after the step of heating the wafer 2 by applying, to the wafer 2, the electromagnetic wave from the IR lamp was performed after the step of performing the etching process with the HF gas being supplied, damages on the wafer 2 such as cracks or breakage were reduced.

(Etching Result—2)

FIGS. 14A to 18B illustrate results obtained by supplying HF gas into the process chamber 1 and performing the etching process on the silicon oxide film and the silicon nitride film formed in advance on the wafer 2 under conditions of a plurality of temperatures, pressures, and so on in the etching processing apparatus 1200 according to the alternative embodiment illustrated in FIG. 12. FIGS. 14A to 18B are graphs each illustrating an example of changes in etching speed over changes in film temperature in a case where respective single layer films of the silicon oxide film and the silicon nitride film were etched by use of hydrogen fluoride gas in the etching processing apparatus according to the embodiment illustrated in FIG. 12.

Embodiment 1 illustrated in FIGS. 7A to 11B deals with results in a case where the etching process was performed such that the flow rates of gases to be supplied into the process chamber 1 were maintained at HF/Ar=0.40/0.20 (L/min), and the total pressure was varied to different values within a range from 300 Pa to 990 Pa. In the present embodiment illustrated in FIGS. 14A to 18B, etching rates over changes in a temperature range of the wafer 2 from −10° C. to −50° C. were detected in a case where the silicon oxide film was etched such that the pressure (total pressure) in the process chamber 1 was maintained at 900 Pa, and the flow rates of HF gas and Ar gas were changed to vary the partial pressure of the HF gas to different values. The flow rates of the gas in the examination of the present embodiment are described in Table 2.

Further, as illustrated in FIG. 13, during the etching on the wafer 2, a voltage of ±1200 V was applied to the electrostatic adsorption electrodes 30, and the wafer 2 was held to be electrostatically adsorbed onto the wafer stage 3. Further, He gas was supplied to between the back surface of the wafer 2 and the upper surface of the wafer stage 3 to promote film over changes in the temperature of the wafer 2. Specific partial pressures (pp) of the HF gas in the examples of the figures are 200 Pa, 400 Pa, 675 Pa, 720 Pa, and 900 Pa.

As illustrated in these figures, it is found that, as the partial pressure of the HF gas during the etching process increases, the etching rate of the silicon oxide film increases, and the temperature range of the wafer 2 in which the etching rate is large becomes higher. Further, it is found that the temperature range in which the etching rate is large becomes wider.

In the present embodiment, while the total pressure was maintained at 900 Pa, the partial pressure of the HF gas was varied to different values. From this, it may be said that the increase in the etching rate of the silicon oxide film or the change in the temperature range to become high as described above depends on the partial pressure of the HF gas. Upper limits of the temperature range where the etching rate of the silicon oxide film is large are summarized as illustrated in Table 2.

TABLE 2

Figure 14A:
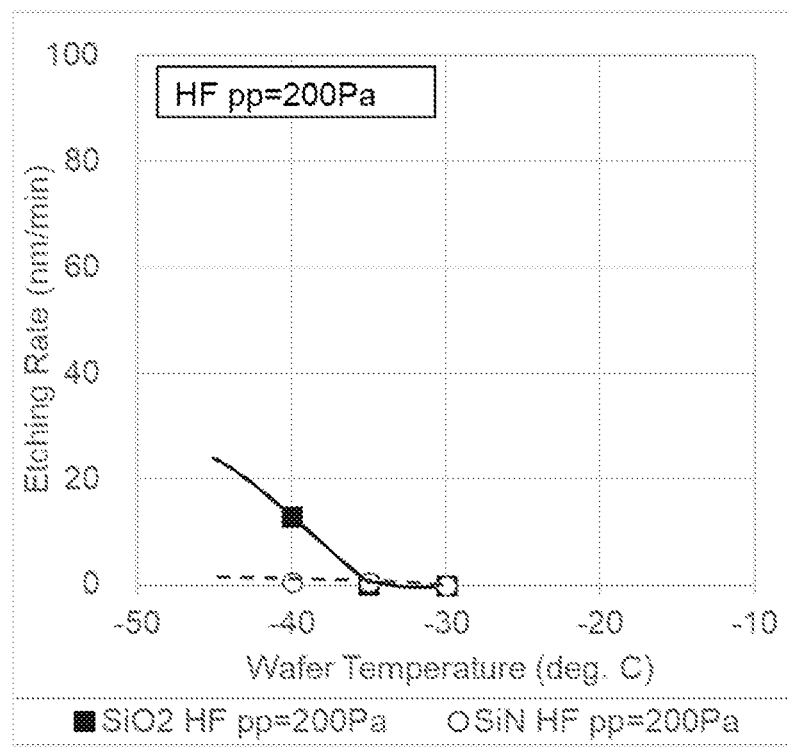
FIGS. 14A and 14B are graphs illustrating examples of changes in etching speed over changes in film temperature in a case where respective single layer films of a silicon oxide film and a silicon nitride film were etched by use of hydrogen fluoride gas in the etching processing apparatus according to the embodiment illustrated in FIG. 12.
Figure 14B:
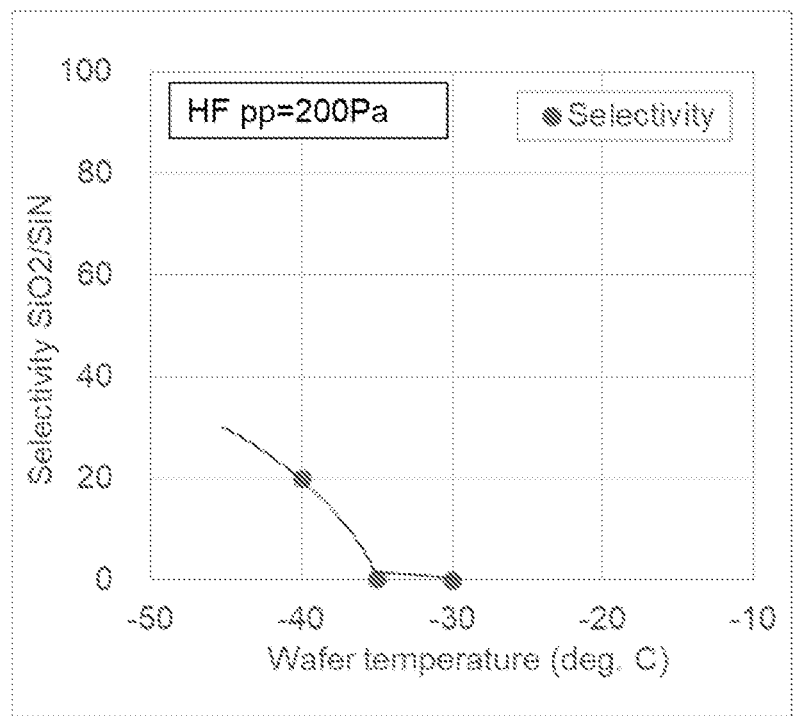
Figure 15A:
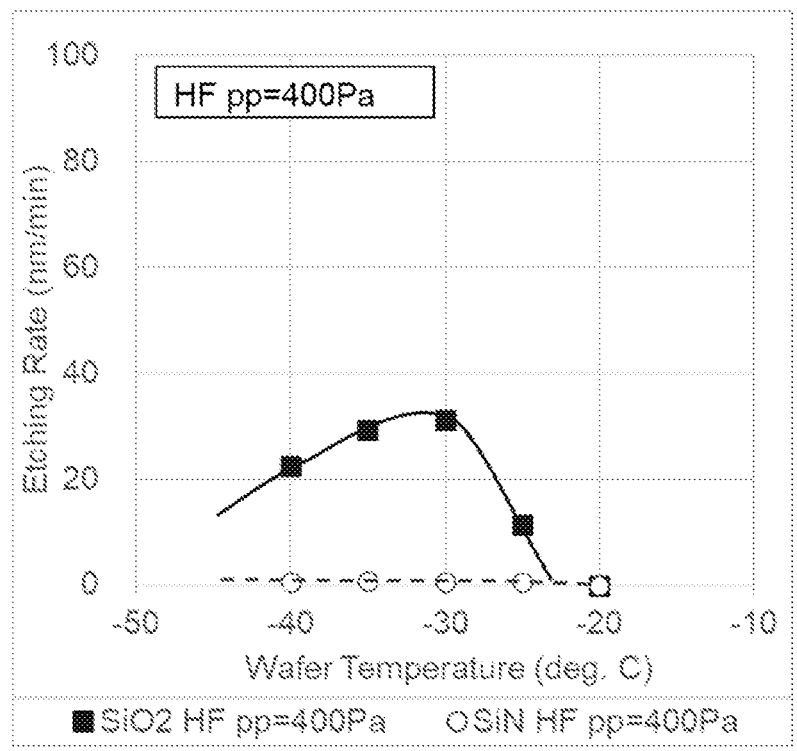
FIGS. 15A and 15B is a graph illustrating an example of changes in etching speed over changes in film temperature in a case where respective single layer films of the silicon oxide film and the silicon nitride film were etched by use of hydrogen fluoride gas in the etching processing apparatus according to the embodiment illustrated in FIG. 12.
Figure 15B:
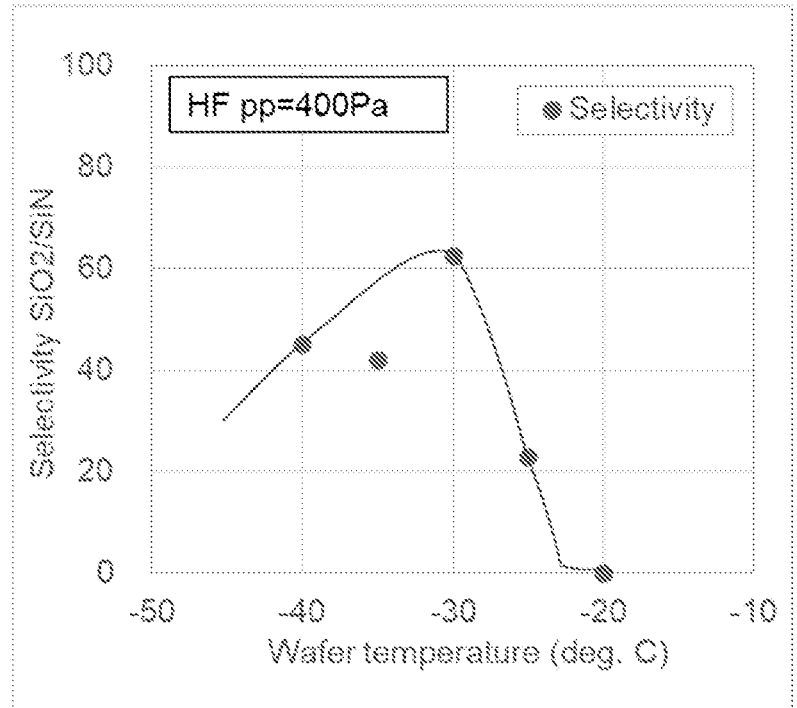
Figure 16A:
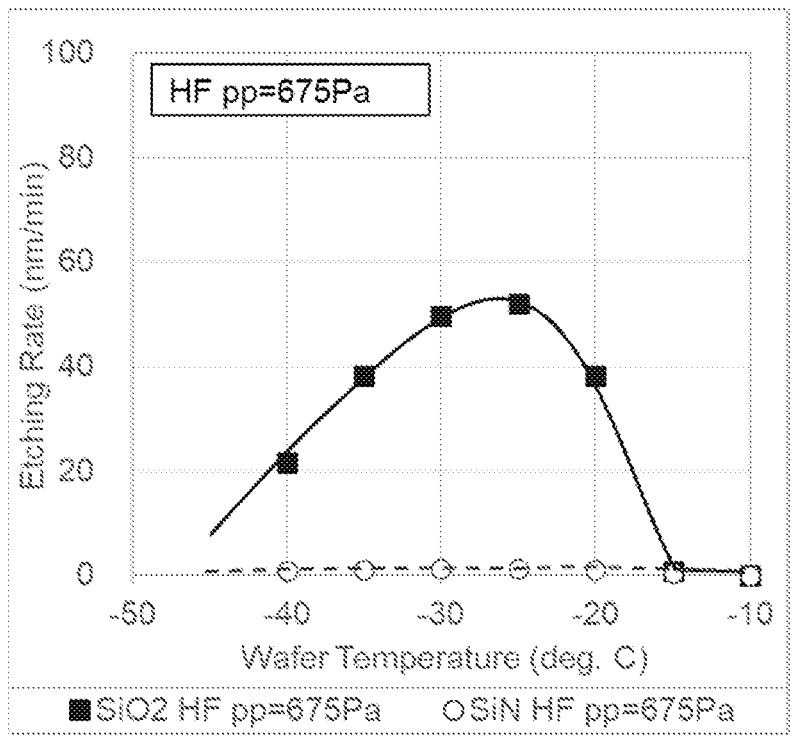
FIGS. 16A and 16B are graphs illustrating examples of changes in etching speed over changes in film temperature in a case where respective single layer films of the silicon oxide film and the silicon nitride film were etched by use of hydrogen fluoride gas in the etching processing apparatus according to the embodiment illustrated in FIG. 12.
Figure 16B:
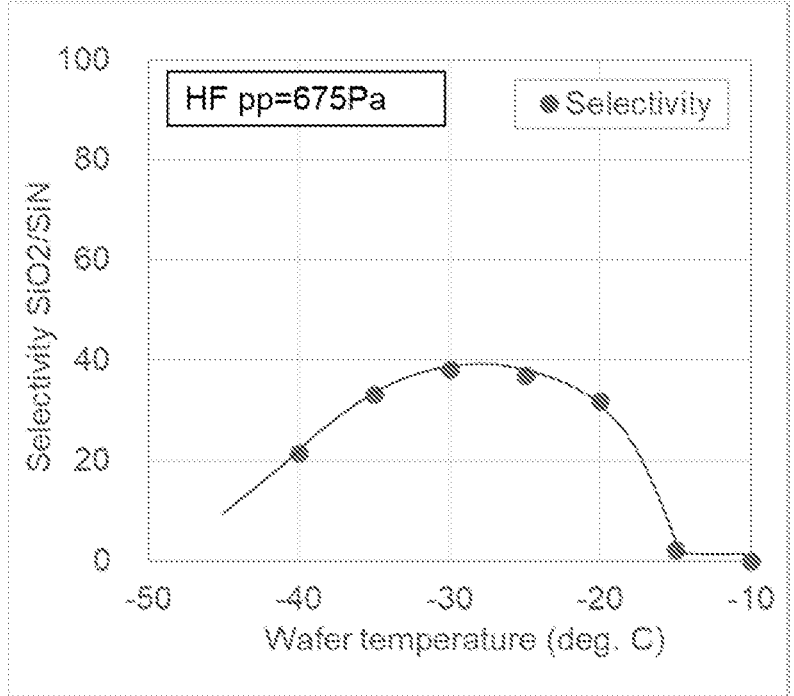
Figure 17A:
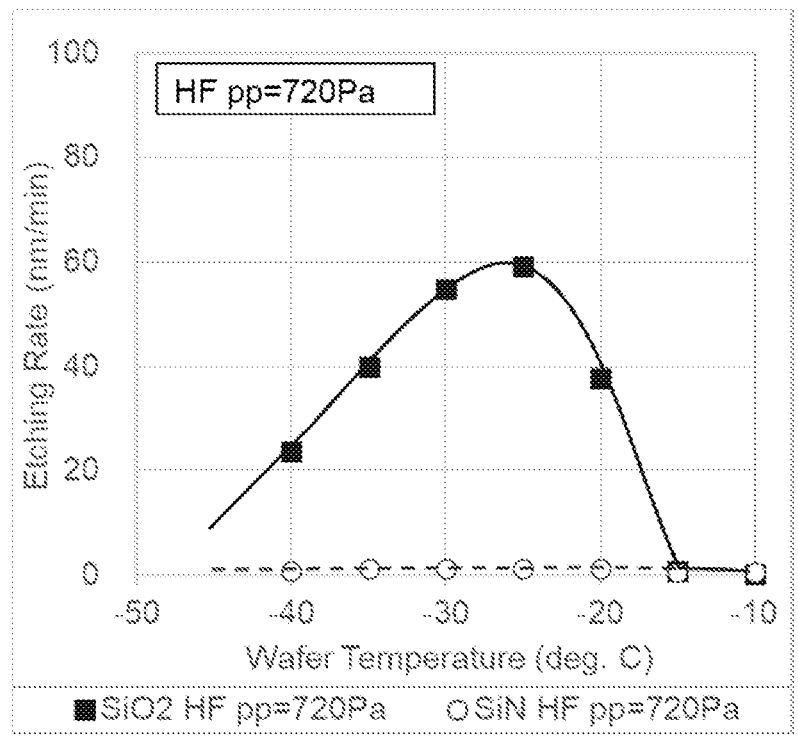
FIGS. 17A and 17B are graphs illustrating an example of changes in etching speed over changes in film temperature in a case where respective single layer films of the silicon oxide film and the silicon nitride film were etched by use of hydrogen fluoride gas in the etching processing apparatus according to the embodiment illustrated in FIG. 12.
Figure 17B:
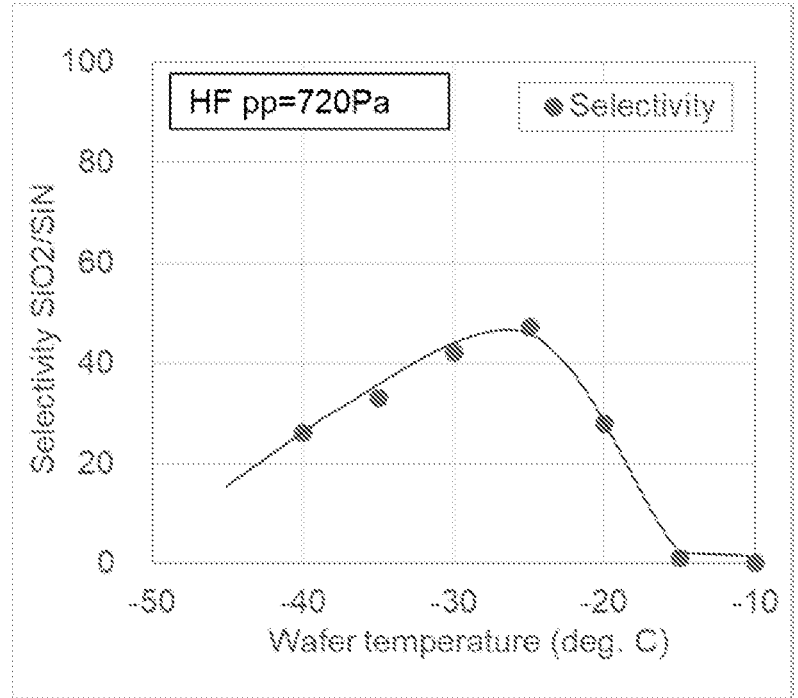
Figure 18A:
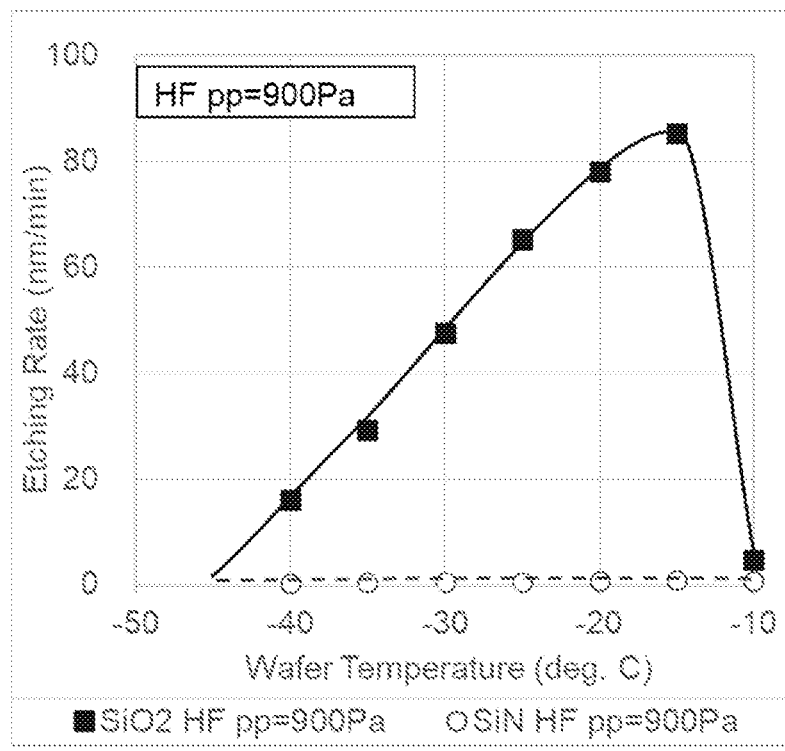
FIGS. 18A and 18B are graphs illustrating examples of changes in etching speed over changes in film temperature in a case where respective single layer films of the silicon oxide film and the silicon nitride film were etched by use of hydrogen fluoride gas in the etching processing apparatus according to the embodiment illustrated in FIG. 12.
Figure 18B:
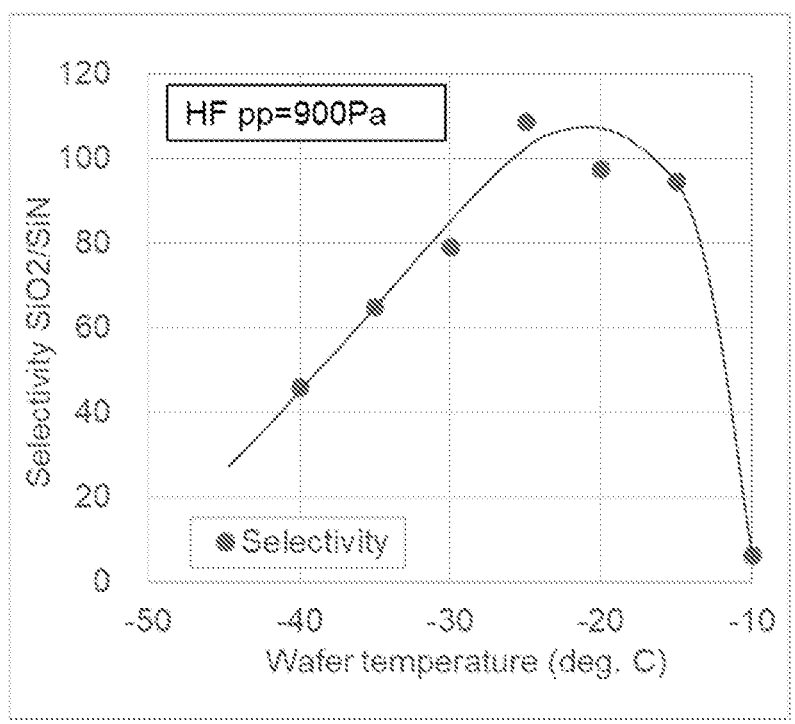

| Pressure and flow rate in etching and maximum temperature in etching on silicon oxide film | | | | | |
|---|---|---|---|---|---|
| Total pressure (Pa) | 900 | 900 | 900 | 900 | 900 |
| HF (L/min) | 0.40 | 0.40 | 0.60 | 0.80 | 0.80 |
| Ar (L/min) | 1.40 | 0.50 | 0.20 | 0.20 | 0 |
| HF partial pressure (Pa) | 200 | 400 | 675 | 720 | 900 |
| Maximum temperature (° C.) | −35 | −23 | −15 | −15 | −10 |
| Reference graph | FIG. 14A | FIG. 15A | FIG. 16A | FIG. 17A | FIG. 18A | heat conduction between the wafer 2 and the wafer stage 3, and the pressure in a gap therebetween was maintained to be 1.0 kPa.

Further, after a step of supplying the HF gas and etching the silicon oxide film was ended, a step of, after the supply of the HF gas was stopped, discharging gas from the process chamber 1 for 20 seconds to discharge particles of the HF gas remaining therein and generated products was performed. After that, while the setting of the temperature of the refrigerant by the chiller 38 was maintained to be the setting in previous steps, the following step was performed: at the same time as gas being discharged from the process chamber 1 with the opening degree of the pressure adjustment valve being set to 100% while the Ar gas was supplied to the process chamber 1 at a flow rate of 0.5 L/min, the wafer 2 was heated for 50 seconds such that a predetermined amount of electric power was supplied to the IR lamp 60 and the electromagnetic wave was applied to the wafer 2. At this time, the supply of the He gas to the gap between the wafer 2 and the wafer stage 3 was stopped.

The highest value of the temperature of the wafer 2 during the step of heating the wafer 2 was about 250° C. After the step of heating the wafer 2, a step of cooling the wafer 2 by supplying the Ar gas into the process chamber 1 at a flow rate of 0.5 L/min for 120 seconds was performed in a state where the supply of electric power to the IR lamp 60 was stopped and the He gas was supplied to the gap between the wafer 2 and the wafer stage 3.

Changes in the etching rate over changes in the temperature of the wafer 2 during the etching process under respective conditions where the HF gas was supplied at different partial pressures are illustrated in A of each of FIGS. 14A to 18A. Further, B of each of the figures illustrates changes in the selection ratio as the ratio of the etching rate of the silicon oxide film to the etching rate of the silicon nitride As illustrated in A of each of FIGS. 14A to 18A, in any of the cases, the etching rate of the silicon nitride film was around 1 nm/min or less than that, and even when the partial pressure of the HF gas was increased, the etching rate did not become larger than around 1 nm/min.

Further, as illustrated in B of each of FIGS. 14B to 18B, the selection ratio as the ratio of the etching rate of the silicon oxide film to that of the silicon nitride film improves as the partial pressure of the HF gas increases. Further, it is also exhibited that the temperature range of the wafer 2 where the selection ratio is equal to or more than 20 becomes wider. Furthermore, it was also found that, under some conditions in which the partial pressure of the HF gas is made high, the selection ratio exhibits a high value around 50.

From the results, it was found that, under a condition where the partial pressure of the HF gas is made high, a relatively high etching rate of the silicon oxide film and a relatively low etching rate of the silicon nitride film are achievable, and the silicon oxide film can be etched at a high selection ratio with respect to the silicon nitride film. Further, it was found that an appropriate temperature range of the wafer 2 during the etching to achieve a high selection ratio varies depending on the value of the partial pressure of the HF gas. A preferable temperature range of the wafer 2 is as follows.

In a case where the partial pressure of the HF gas is 200 Pa, the preferable temperature range of the wafer 2 is from −35° C. to −60° C., more desirably from −35° C. to −50° C. In a case where the partial pressure of the HF gas is 400 Pa, a temperature from −23° C. to −60° C. is desirable, and a temperature from −23° C. to −50° C. is more desirable.

In a case where the partial pressure of the HF gas is 675 Pa, a temperature from −15° C. to −60° C. is desirable, and a temperature from −15° C. to −50° C. is more desirable.

Further, in a case where the partial pressure of the HF gas is 720 Pa, a temperature from −15° C. to −60° C. is desirable, and a temperature from −15° C. to −50° C. is more desirable. From this, it is apparent that the temperature range corresponding to a range of the partial pressure of the HF gas from 675 Pa to 720 Pa should be selected. Further, as described in Embodiment 1, the temperature range corresponding to a range of the partial pressure of the HF gas from 600 Pa to 660 Pa can be selected, and in consideration of this, it is also apparently expectable that the temperature range corresponding to a range of the partial pressure of the HF gas from 600 Pa to 720 Pa can be selected.

Further, in a case where the partial pressure of the HF gas is 900 Pa, a wafer temperature from −10° C. to −60° C. is desirable, and a wafer temperature from −10° C. to −50° C. is more desirable.

It is considered that, even when the wafer temperature is from −50° C. to −60° C., the silicon oxide film can be etched. However, the wafer temperature is more desirably equal to or more than −50° C.

A film structure including a laminated film of the silicon oxide films 203 and the silicon nitride films 202 as illustrated in FIGS. 2 A and 2B was etched inside the process chamber 1 set to a predetermined pressure with the partial pressure of the HF gas being varied to different values illustrated in Table 2 and the temperature of the wafer being varied to different values. As a result, at a temperature higher than the maximum temperatures in Table 2, the etching hardly advanced. Further, it was found that, when the temperature is excessive, the amount of etching tends to become small. It was found that an appropriate temperature range is a wafer temperature from −35° C. to −50° C. when the partial pressure of the HF gas is 200 Pa.

Further, the desirable shape after machining as illustrated in FIG. 2B was obtained by performing the etching process at a wafer temperature having a value in any of the following ranges: a wafer temperature from −23° C. to −50° C. at an HF-gas partial pressure of 400 Pa; a wafer temperature from −15° C. to −50° C. at an HF-gas partial pressure of 675 Pa; a wafer temperature from −15° C. to −50° C. at an HF-gas partial pressure of 720 Pa; and a wafer temperature from −10° C. to −50° C. at an HF-gas partial pressure of 900 Pa. Note that, by heating of the wafer 2 after the steps of the etching process, a residue such as a residual substance on the surface after the process was reduced.

Further, since the etching processing apparatus 1200 of the present embodiment includes the plasma source that can form ICP plasma, a cleaning step of forming $O_2$ plasma by introducing $O_2$ gas into the quartz chamber 12 and removing an attached substance on an inner surface inside the process chamber 1 or the quartz chamber 12 by charged particles formed by the plasma or particles having reactivity can be performed before start of the steps of the etching process on the wafer 2 as illustrated in FIG. 13. The cleaning was performed for 300 seconds such that $O_2$ gas was supplied at a flow rate 1.0 L/min in a state where the pressure inside the process chamber 1 or the quartz chamber 12 was set to 50 Pa, and high-frequency power at 1500 W was supplied to the ICP coil 20. Hereby, the occurrence of foreign matter on the wafer 2 could be reduced.

Embodiment 3

(Etching Result—3)

Subsequently, FIGS. 19A and 19B illustrate results obtained by supplying HF gas into the process chamber 1 and performing the etching process on the silicon oxide film and the silicon nitride film formed in advance on the wafer 2 under a plurality of conditions in the etching processing apparatus 100 according to the embodiment illustrated in FIG. 1. FIGS. 19A and 19B exhibit graphs each illustrating an example of changes in etching speed over changes in film temperature in a case where respective single layer films of the silicon oxide film and the silicon nitride film were etched by use of hydrogen fluoride gas in the etching processing apparatus according to the embodiment illustrated in FIG. 1.

Embodiment 1 illustrated in FIGS. 7A to 11B deals with results of the etching process performed such that the flow rates of process gases to be supplied were maintained at HF/Ar=0.40/0.20 (L/min), and the pressure (total pressure) in the process chamber 1 was varied to different values from 300 Pa to 990 Pa. The example illustrated in FIGS. 19A and 19B exhibits results each obtained by performing the etching process illustrated in FIGS. 4, 5 with the temperature of the wafer 2 being varied in a range from −10° C. to −50° C. in each of the cases where the pressure (total pressure) in the process chamber 1 was maintained at 300 Pa, the flow rate of Ar gas was maintained at 0.20 L/min, and the flow rate of HF gas was varied to different values of 0.40, 0.60, and 0.80 L/min.

In the present embodiment, similarly to the embodiment illustrated in FIGS. 7A to 11B, prior to the step of etching, the pressure in the process chamber 1 was maintained at 900 Pa, and the Ar gas was supplied at a flow rate of 1.0 L/min for 60 seconds, so that the temperature of the wafer 2 was adjusted to approach that of the wafer stage 3. After that, a step of etching the silicon oxide film and the silicon nitride film on the wafer 2 by supplying the HF gas and the Ar gas at predetermined flow rates for 120 seconds in a state where the pressure (total pressure) in the process chamber 1 was maintained at 300 Pa was performed. Respective partial pressures (pp) of the HF gas in respective cases where the flow rate of the HF gas in the step of etching was set to 0.40, 0.60, 0.80 L/min were 200 Pa, 225 Pa, and 240 Pa.

Further, after the step of etching was ended, remaining particles or gases were discharged by discharging gas from the process chamber 1 for 20 seconds, and then, the setting of the temperature of the refrigerant by the chiller 38 was maintained, and the wafer 2 was heated for 50 seconds such that electric power was supplied to the IR lamp 60 with the opening degree of the pressure adjustment valve 14 being set to 100% while the Ar gas was supplied at a flow rate of 0.5 L/min. The highest temperature of the wafer 2 during the step of heating was about 250° C. After the step of heating was ended by stopping the supply of electric power to the IR lamp 60, a step of cooling the wafer 2 to a temperature close to that of the wafer stage 3 such that the Ar gas was supplied at a flow rate of 1.0 L/min for 120 seconds while the pressure (total pressure) in the process chamber 1 was maintained at 900 Pa was performed.

Figure 11B:
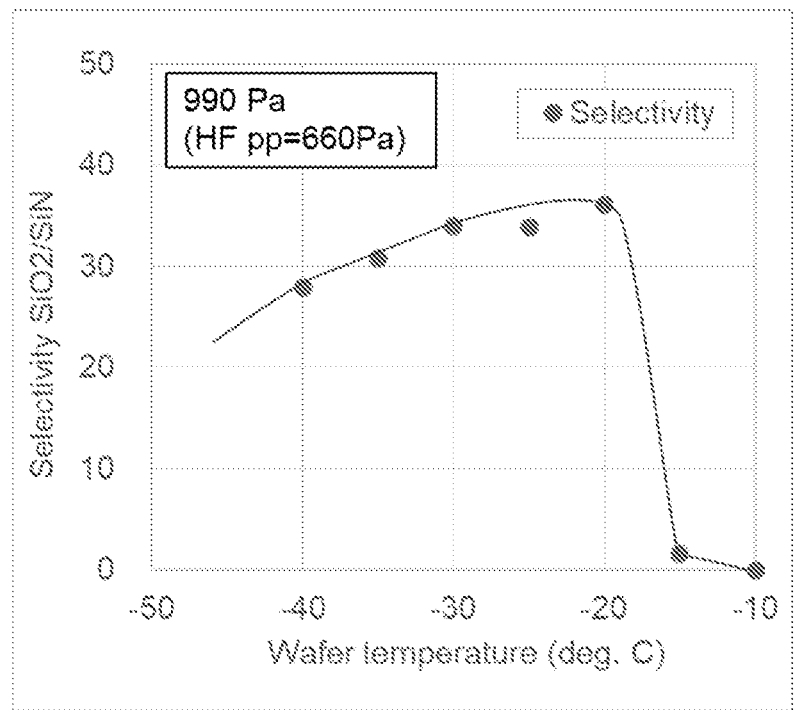

FIG. 19A illustrates respective etching rates of the silicon oxide film and the silicon nitride film over changes in the temperature of the wafer 2 at different flow rates of the HF gas. Further, the ratio of the etching rate of the silicon oxide film to that of the silicon nitride film is taken as a selection ratio, and changes in the selection ratio over changes in the temperature of the wafer are illustrated in FIG. 11B. When the flow rate of the HF gas changes, the partial pressure of the HF gas also changes. Specific HF partial pressures (pp) are 200 Pa, 225 Pa, and 240 Pa.

As illustrated in FIG. 19A, it is found that, as the flow rate of the HF gas to be supplied increases, the etching rate of the silicon oxide film increases, but the upper limit of the temperature range in which the etching rate becomes large hardly changes or slightly changes. Further, it is found that the temperature range in which the etching rate becomes large hardly changes or slightly changes. The present embodiment deals with an example in which the flow rate of the HF gas was varied while the total pressure in the process chamber 1 was maintained at 300 Pa. From this, it is found that the previously described increase in the etching rate of the silicon oxide film and the temperature range in which the etching rate becomes large do not largely depend on the flow rate of the HF gas.

Upper limits of the temperature range in which the etching rate of the silicon oxide film becomes large are summarized as illustrated in Table 3.

TABLE 3

Pressure and flow rate in etching and maximum temperature in etching on silicon oxide film

| Total pressure (Pa) | 300 | 300 | 300 |
|---|---|---|---|
| HF (L/min) | 0.40 | 0.60 | 0.80 |
| Ar (L/min) | 0.20 | 0.20 | 0.20 |
| HF partial pressure (Pa) | 200 | 225 | 240 |
| Maximum temperature (° C.) | −35 | −35 | −35 |
| Reference graph | | FIG. 19A | |

As illustrated in FIG. 19A, in any of the cases, the etching rate of the silicon nitride film was around 1 nm/min or less than that, and even when the flow rate of the HF gas was increased, an increase in the etching rate was not observed. Further, as illustrated in FIG. 19B, it was found that, even when the HF flow rate increases, the selection ratio as the ratio of the etching rate of the silicon oxide film to that of the silicon nitride film exhibits only slight changes, and a temperature region where the selection ratio exhibits 20 or more does not change.

From the above results, it was found that, in order to achieve a relatively high etching rate of the silicon oxide film and a relatively low etching rate of the silicon nitride film and to achieve etching on the silicon oxide film at a high selection ratio, a preferable wafer temperature varies depending on the partial pressure of the HF gas. A preferable temperature range of the wafer is more specifically as follows.

At an HF-gas flow rate of 0.40 L/min (at an HF partial pressure of 200 Pa), at an HF-gas flow rate of 0.60 L/min (at an HF partial pressure of 225 Pa), or at an HF-gas flow rate of 0.80 L/min (at an HF partial pressure of 240 Pa), the temperature of the wafer 2 is desirably from −35° C. to −60° C., more desirably −35° C. to −50° C.

It is considered that, even when the temperature of the wafer 2 is from −50° C. to −60° C., the silicon oxide film can be etched. However, the temperature of the wafer 2 is desirably equal to or more than −50° C.

A film structure including a laminated film of the silicon oxide films 203 and the silicon nitride films 202 as illustrated in FIGS. 2A and 2B was etched such that the partial pressure of the HF gas was adjusted to the values illustrated in Table 3 and the temperature of the wafer 2 was varied, but the etching hardly advanced as expected when the temperature of the wafer 2 was higher than the values exhibited in the maximum temperature in Table 3 at a predetermined pressure. Further, when the temperature is too low, the amount of etching tends to become small. As a result of examination, it was found that, at the HF-gas flow rate of 0.40 L/min (at the HF partial pressure of 200 Pa), at the HF flow rate of 0.60 L/min (at the HF partial pressure of 225 Pa), or at the HF flow rate of 0.80 L/min (at the HF partial pressure of 240 Pa), the desired shape after machining as illustrated in FIG. 2B is obtained by performing the etching process illustrated in FIGS. 4, 5 with the temperature of the wafer 2 being set to a value within a range from −35° C. to −50° C. Further, at this time, by performing heating after the steps of the etching process, a residue such as a residual substance on the surface after machining was decreased.

(Examination Result)

Pieces of data illustrated in Tables 1 to 3 thus examined in the above embodiments are summarized in FIG. 20. FIG. 20 is a graph illustrating the relationship of changes in the temperature of the wafer with changes in the partial pressure of the hydrogen fluoride (HF) gas in a case where respective single layer films of the silicon oxide film and the silicon nitride film were etched by use of the hydrogen fluoride gas in either of the etching processing apparatuses according to the embodiments illustrated in FIGS. 1, 12. In this figure, a partial pressure (x) of the HF gas is taken along the lateral axis, an upper limit (y) of the temperature range in which the etching rate of the silicon oxide film becomes large is taken along the vertical axis, and the results of Tables 1 to 3 are indicated by triangular marks.

As illustrated in this figure, it is found that the relationship, indicated by each triangular point, between the value x of the partial pressure of the HF gas and the upper limit y of the temperature range in which the etching rate of the silicon oxide film is large (etching can be performed practically) can be approximated to a linear function. Such a function can be expressed as the following (Formula 5).

$$y = 0.040x - 42.0 \quad \text{(Formula 5)}$$

From this, it is found that, in a case where the partial pressure of the HF gas is within a range from 50 Pa to 1000 Pa, when the temperature of the wafer 2 or the silicon oxide film during etching is set to a value equal to or less than $y = 0.040x - 42.0$ expressed by (Formula 5) but equal to or more than −60° C., preferably equal to or more than −50° C., the silicon oxide film can be etched at a high selection ratio with respect to the silicon nitride film. Note that, as described above, at a temperature higher than (Formula 5) $y = 0.040x - 42.0$, the etching rate of the silicon oxide film is small, and therefore, the etching on the film cannot be performed practically.

Further, it is known that, in a case where the hydrogen fluoride gas (HF) is used together with gas of alcohol or water, the silicon oxide film is etched as expressed by (Formula 1), (Formula 2).

In a case where the HF and the gas of methanol or water are used, respective gases are adsorbed to the surface of the silicon oxide film, and the HF and the methanol or water are assumed to be liquefied in a state where they are adsorbed to the surface. After that, two molecules in the HF gas react with the methanol ($CH_3OH$) or water ($H_2O$) to generate $HF_2^-$ as active species on the surface of the silicon oxide film (Formula 1). According to the examination of the inventors, it is considered that the generation of $HF_2^-$ has a large influence on the reaction rate of etching on the silicon oxide film. Further, $HF_2^-$ reacts with $SiO_2$ to generate $SiF_4$ (having a boiling point of −94.8° C.), and when $SiF_4$ volatilizes, etching occurs.

In the etching on the silicon oxide film to be performed by using hydrogen fluoride gas solely or by using hydrogen fluoride gas and inert gas such as Ar, as found by the inventors, plasma is not formed, and further, a component containing an OH group such as alcohol or water is not supplied from outside. However, since the etching rate is relatively large, it is assumed that $HF_2$ serves as active species and causes etching.

As expressed by (Formula 2), water is a reaction product, and once etching starts, water is generated continuously. However, in the early stage of the etching, some sort of water to generate $HF_2^-$ is required. Since a very small amount of water is contained in the silicon oxide film, it is considered that the reaction occurs due to the very small amount of water. Further, the aforementioned etching processing apparatus 100 or the like includes, in its inside, a component made of quartz, and therefore, it is considered that water present in the quartz component also relates to the reaction.

In the examination in the present invention, in proportion to the partial pressure of the HF, the temperature at which the etching on the silicon oxide film occurred increased. From basic examinations, in order to decrease the volume V of gas with the same number of moles, that is, in order to easily aggregate gas to cause etching, it is apparent that it is necessary to decrease the temperature T or increase the pressure P. Since the HF partial pressure was increased this time, adsorption or aggregation of the HF onto the silicon oxide film easily occurred, and it is considered that etching consequently occurred at a higher temperature as compared with a case where the HF partial pressure was low.

As expressed by (Formula 1), in order to generate $HF_2^-$ as active species for the reaction, MOH, herein, water with M=H is required. In the meantime, water is a reaction product as expressed by (Formula 2), and removal of water is indispensable to advance the reaction. When water is present excessively, a reaction to generate $SiO_2$ as silicon oxide and silicofluoric acid $H_2SiF_6$ occurs.

Accordingly, in order to inhibit regeneration of $SiO_2$ as silicon oxide, it is necessary to remove water immediately. Here, the melting point of a hydrofluoric acid aqueous solution with a concentration of 50% that is close to a saturated solution is −35° C. at normal pressure. From this, it is considered that, on the surface of the silicon oxide film, water generated by the reaction is mixed with supplied hydrogen fluoride gas and turns into hydrofluoric acid close to the saturated solution, and when the hydrofluoric acid turns into a solid, water is removed in a sense, so that etching occurs.

The embodiments of the present invention have been described above, but the present invention is not limited to the above embodiments, and various modifications can be made without departing from the gist of the present invention.

DESCRIPTION OF REFERENCE NUMERALS 1 process chamber
2 wafer
3 wafer stage
11 base chamber
12 quartz chamber
13 plasma
14 pressure adjustment valve
15 gas discharge pump
16 evacuation pipe
20 ICP coil
21 high frequency source
22 matching device
23 shower plate
24 gas distribution plate
25 top plate
26 slit plate
27 flow path
30 electrostatic adsorption electrode
31 electrostatic adsorption DC voltage source
38 chiller
39 flow path
50 massflow controller
51 gas distributor
52 Ar gas
54 valve
55 He gas
56 protrusion
57 gas introduction tube
60-1, 60-2, 60-3 IR lamp
61 reflector
70 thermoelectric couple
71 thermocouple thermometer
72 IR light transmission window
73 IR lamp power supply
74 high-frequency cut filter
100 etching processing apparatus
201 substrate
202 silicon nitride film
203 silicon oxide film
204 opening
205 laminated film
1200 etching processing apparatus

The invention claimed is:

1. A dry etching processing method for etching a film structure without the use of plasma by supplying gas for process into a process chamber, the film structure being a structure in which a side wall of a groove or a hole is constituted by respective end parts of laminated film layers formed in advance on a wafer placed inside the process chamber, the laminated film layers including silicon oxide films each sandwiched between silicon nitride films in an up-down direction, the etching processing method comprising:
a step of etching the silicon oxide films laterally from the end parts by supplying hydrogen fluoride gas with a pressure of the process chamber being maintained at 600 Pa and a temperature of the wafer being maintained at a value within a range from −25° C. to −60° C., desirably from −25° C. to −50° C.,
wherein the silicon oxide films are etched laterally from the end parts with a partial pressure of the hydrogen fluoride gas being set to 400 Pa.

2. The etching processing method according to claim 1, comprising:
a step of heating the wafer in the process chamber after the step of etching the silicon oxide films.

3. The etching processing method according to claim 1, wherein:
the step of etching the silicon oxide films and a step of heating the wafer in the process chamber after the step of etching are repeated a plurality of times.

4. The etching processing method according to claim 1, wherein:
after the wafer is conveyed into the process chamber but before the etching is ended, gas containing an OH group is not supplied into the process chamber.

5. A dry etching processing method for etching a film structure without the use of plasma by supplying gas for process into a process chamber, the film structure being a structure in which a side wall of a groove or a hole is constituted by respective end parts of laminated film layers formed in advance on a wafer placed inside the process chamber, the laminated film layers including silicon oxide films each sandwiched between silicon nitride films in an up-down direction, the etching processing method comprising:

a step of etching the silicon oxide films laterally from the end parts by supplying hydrogen fluoride gas with a pressure of the process chamber being maintained to be from 900 Pa to 990 Pa and a temperature of the wafer being maintained at a value within a range from −15° C. to −60° C., desirably from −15° C. to −50° C., wherein the silicon oxide films are etched laterally from the end parts with a partial pressure of the hydrogen fluoride gas being set to be from 600 to 720 Pa.

6. The etching processing method according to claim 5, comprising:

a step of heating the wafer in the process chamber after the step of etching the silicon oxide films.

7. The etching processing method according to claim 5, wherein:

the step of etching the silicon oxide films and a step of heating the wafer in the process chamber after the step of etching are repeated a plurality of times.

8. The etching processing method according to claim 5, wherein:

after the wafer is conveyed into the process chamber but before the etching is ended, gas containing an OH group is not supplied into the process chamber.

9. A dry etching processing method for etching a film structure without the use of plasma by supplying gas for process into a process chamber, the film structure being a structure in which a side wall of a groove or a hole is constituted by respective end parts of laminated film layers formed in advance on a wafer placed inside the process chamber, the laminated film layers including silicon oxide films each sandwiched between silicon nitride films in an up-down direction, the etching processing method comprising:

etching the silicon oxide films laterally from the end parts by supplying hydrogen fluoride gas into the process chamber with a temperature of the wafer being maintained to be equal to or less than $(0.040x-42.0)?C$ when a partial pressure of the hydrogen fluoride gas is taken as x (Pa).

10. The etching processing method according to claim 9, wherein:

the silicon oxide films are etched laterally from the end parts with the temperature of the wafer being maintained to be equal to or more than −50?C.

11. The etching processing method according to claim 9, comprising:

a step of heating the wafer in the process chamber after the step of etching the silicon oxide films.

12. The etching processing method according to claim 9, wherein:

the step of etching the silicon oxide films and a step of heating the wafer in the process chamber after the step of etching are repeated a plurality of times.

13. The etching processing method according to claim 9, wherein:

after the wafer is conveyed into the process chamber but before the etching is ended, gas containing an OH group is not supplied into the process chamber.

* * * * *